US008053145B2

(12) United States Patent
Ohnuma

(10) Patent No.: US 8,053,145 B2
(45) Date of Patent: Nov. 8, 2011

(54) METHOD FOR MANUFACTURING HOLOGRAPHIC RECORDING MEDIUM AND METHOD FOR MANUFACTURING SEMICONDUCTOR DEVICE

(75) Inventor: Hideto Ohnuma, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 764 days.

(21) Appl. No.: 11/802,801

(22) Filed: May 25, 2007

(65) Prior Publication Data
US 2008/0176145 A1 Jul. 24, 2008

(30) Foreign Application Priority Data

May 30, 2006 (JP) ................................. 2006-149779

(51) Int. Cl.
G03H 1/02 (2006.01)
(52) U.S. Cl. .................. 430/1; 430/2; 430/311; 359/15; 359/12; 359/32
(58) Field of Classification Search .................. None
See application file for complete search history.

(56) References Cited

U.S. PATENT DOCUMENTS

| 3,542,452 | A | * | 11/1970 | Gerritsen et al. | 359/4 |
| 3,677,634 | A | * | 7/1972 | Mathisen | 355/2 |
| 4,111,698 | A | * | 9/1978 | Sato | 430/496 |
| 4,244,633 | A | * | 1/1981 | Kellie | 359/3 |
| 4,857,425 | A | * | 8/1989 | Phillips | 430/1 |
| 5,774,240 | A | * | 6/1998 | Goto et al. | 359/12 |
| 6,005,666 | A | * | 12/1999 | Dandliker et al. | 356/505 |
| 6,842,465 | B2 | | 1/2005 | Lee | |
| 7,092,134 | B1 | * | 8/2006 | Han et al. | 359/35 |
| 2003/0039896 | A1 | * | 2/2003 | Iriguchi | 430/5 |
| 2004/0169837 | A1 | * | 9/2004 | Pril et al. | 355/71 |
| 2005/0002311 | A1 | * | 1/2005 | Ichihara et al. | 369/103 |
| 2006/0121357 | A1 | * | 6/2006 | Clube | 430/1 |
| 2006/0232838 | A1 | * | 10/2006 | Clube | 359/12 |
| 2007/0092804 | A1 | * | 4/2007 | Kolb et al. | 430/2 |
| 2007/0206253 | A1 | * | 9/2007 | Ohnuma | 359/12 |

FOREIGN PATENT DOCUMENTS

| EP | 462698 | * | 12/1991 |
| JP | 2004-253660 | | 9/2004 |
| JP | 2004-302017 | * | 10/2004 |

OTHER PUBLICATIONS

Iriguchi et al "05. fine-gate TFT fabrication on 300 x 300 mm2 glass substrate using holographic microlithography" SID 03 Dig paper 34.3 pp. 1092-1095 (2003).*
Lorenz et al. "Direct laser write on electrolessly deposited thin metal films for applications in micro- and nanofuidics" Langmuir vol. 20 pp. 1833-1837 (2004).*
Clube et al., "holographic microlithography", Opt. Eng. vol. 34(9) pp. 2724-2730 (Sep. 1995).*
Machine translation of JP 2004-253660 (Sep. 2004).*
U.S. Appl. No. 60/728,941, filed Oct. 18, 2005.*

* cited by examiner

*Primary Examiner* — Martin Angebranndt
(74) *Attorney, Agent, or Firm* — Nixon Peabody LLP; Jeffrey L. Costellia

(57) ABSTRACT

To provide a method for manufacturing a holographic recording medium and a method for manufacturing a semiconductor device, by which effects of distortion or irregularities of the surface of an exposure object can be reduced. The method includes the steps of: splitting a laser beam emitted from a laser oscillator into a first laser beam and a second laser beam, and forming a fringe pattern in a holographic recording medium by illuminating the holographic recording medium with the first laser beam through a mask and illuminating the holographic recording medium with the second laser beam. The mask is a substrate having a light-shielding film formed over its surface.

24 Claims, 17 Drawing Sheets ically illuminating the holographic recording medium with the
METHOD FOR MANUFACTURING HOLOGRAPHIC RECORDING MEDIUM AND METHOD FOR MANUFACTURING SEMICONDUCTOR DEVICE

BACKGROUND OF THE INVENTION

1. Field of the Invention

The present invention relates to a holographic recording medium, a method for manufacturing the same, and an exposure method using the same. More specifically, the invention relates to a holographic recording medium, a method for manufacturing the same, and an exposure method using the same, by which adverse effects of distortion or irregularities of the surface of an exposure object can be reduced. In addition, the present invention relates to a method for a manufacturing a semiconductor device.

2. Description of the Related Art

In recent years, an exposure technique using holography has drawn attention as a pattern formation method in the process of manufacturing a semiconductor device. The exposure technique using holography includes a first step (a recording step) of recording a hologram into a medium for the recording of a hologram by illuminating the holographic recording medium with an object beam and a reference beam, i.e., a step of forming a holographic recording medium, and a second step (a reconstruction step) of illuminating the holographic recording medium with a reconstruction beam, so that a reconstruction image of the fringe pattern that is formed in the holographic recording medium is printed into a resist.

In the recording step, the holographic recording medium is illuminated with a first laser beam (an object beam) through a mask (an original mask) having a desired pattern, and at the same time, the holographic recording medium is illuminated with a second laser beam (a reference beam) from a direction different from the first laser beam. Thus, by illuminating the holographic recording medium with the first laser beam and the second laser beam at the same time, a fringe pattern is recorded in the holographic recording medium. In the reconstruction step, on the other hand, a resist formed over an element formation substrate is illuminated with a laser beam (a reconstruction beam) through the holographic recording medium having the fringe pattern, so that diffraction rays for reproducing the original mask pattern (a reconstruction image) are projected onto the resist.

Research has been conducted on micropattern formation methods (reduction-projection exposure) or the like. For example, in a holographic exposure technique, laser beams that are emitted from different kinds of laser oscillators are used in the recording step and the reconstruction step, so that a pattern with a smaller feature size than the original pattern is printed into a resist (for example, see Reference 1: Japanese Published Patent Application No. 2004-253660).

SUMMARY OF THE INVENTION

A holographic exposure method is free from aberration of lenses because it requires no optical lens when illuminating a photosensitive material (resist) with light. However, while the holographic exposure method can obtain higher resolution than a photolithographic exposure method, it has a disadvantage in small depth of focus. Therefore, when illuminating a resist formed over an element formation substrate by using holography, if the surface of the element formation substrate has distortion, the resist formed thereover could also have distortion or irregularities, which could result in insufficient exposure of the resist. As a result, there is a problem in that formation of an accurate resist pattern is hindered.

In view of the foregoing problems, it is an object of the invention to provide a holographic exposure method, in particular, a holographic recording medium, a method for manufacturing the same, and an exposure method using the same, by which adverse effects of distortion or irregularities of the surface of an exposure object can be reduced and accurate exposure can be performed.

One aspect of the invention is an exposure method which includes the steps of: splitting a laser beam emitted from a first laser oscillator into a first laser beam and a second laser beam, illuminating a holographic recording medium with the first laser beam through an original mask, while at the same time illuminating the holographic recording medium with the second laser beam, thereby forming a fringe pattern in the holographic recording medium; and illuminating a resist formed over an element formation substrate with a third laser beam emitted from a second laser oscillator through the holographic recording medium. The original mask is a light-transmissive substrate having a light-shielding film formed over its surface, and the thickness of the light-shielding film is greater than or equal to a maximum difference in elevation of a surface of the resist.

In accordance with one aspect of the above-described exposure method of the invention, the step of illuminating the resist with the third laser beam is performed by forming a shape of the third laser beam into a linear beam and by using an autofocusing method in which the focus of the third laser beam on the surface of the resist is automatically adjusted.

In accordance with one aspect of the above-described exposure method of the invention, the thickness of the light-shielding film is in a range of 0.3 to 10 μM, inclusive.

One aspect of the invention is a holographic recording medium formed by the steps of: splitting a laser beam emitted from a first laser oscillator into a first laser beam and a second laser beam, and illuminating a holographic recording medium with the first laser beam though an original mask, while at the same time illuminating the hologram recording medium with the second laser beam, thereby forming a fringe pattern in the holographic recording medium. The holographic recording medium is used in illuminating a resist formed over an element formation substrate with a third laser beam. The original mask is a light-transmissive substrate having a light-shielding film formed over its surface, and the thickness of the light-shielding film is greater than or equal to a maximum difference in elevation of a surface of the resist.

In accordance with one aspect of the above-described holographic recording medium of the invention, the thickness of the light-shielding film is in a range of 0.3 to μm, inclusive.

One aspect of the invention is a method for manufacturing a holographic recording medium, which includes the steps of: splitting a laser beam emitted from a first laser oscillator into a first laser beam and a second laser beam, and illuminating a holographic recording medium with the first laser beam through an original mask, while at the same time illuminating the holographic recording medium with the second laser beam, thereby forming a fringe pattern in the holographic recording medium. The holographic recording medium is used in illuminating a resist formed over an element formation substrate with a third laser beam. The original mask is a light-transmissive substrate having a light-shielding film formed over its surface, and the thickness of the light-shielding film is greater than or equal to a maximum difference in elevation of a surface of the resist.

In accordance with one aspect of the above-described method for manufacturing a holographic recording medium of the invention, the thickness of the light-shielding film is in a range of 0.3 to 10 μm, inclusive.

The thickness of the light-shielding film of the original mask is determined by taking into account the distortion or irregularities of an exposure object, and the exposure object is illuminated with a laser beam through a holographic recording medium whose fringe pattern has been formed by using the original mask having the light-shielding film, whereby it becomes possible to reduce the adverse effects of the distortion or irregularities of the exposure object in the exposure process. Therefore, even when a pattern of a wiring layer is formed by using a holographic exposure method in the process of manufacturing a semiconductor device, failures of exposure of the resist that is used in etching a wiring can be prevented, whereby breaking of wirings and the like can be prevented.

DETAILED DESCRIPTION OF THE INVENTION

Figure 1:
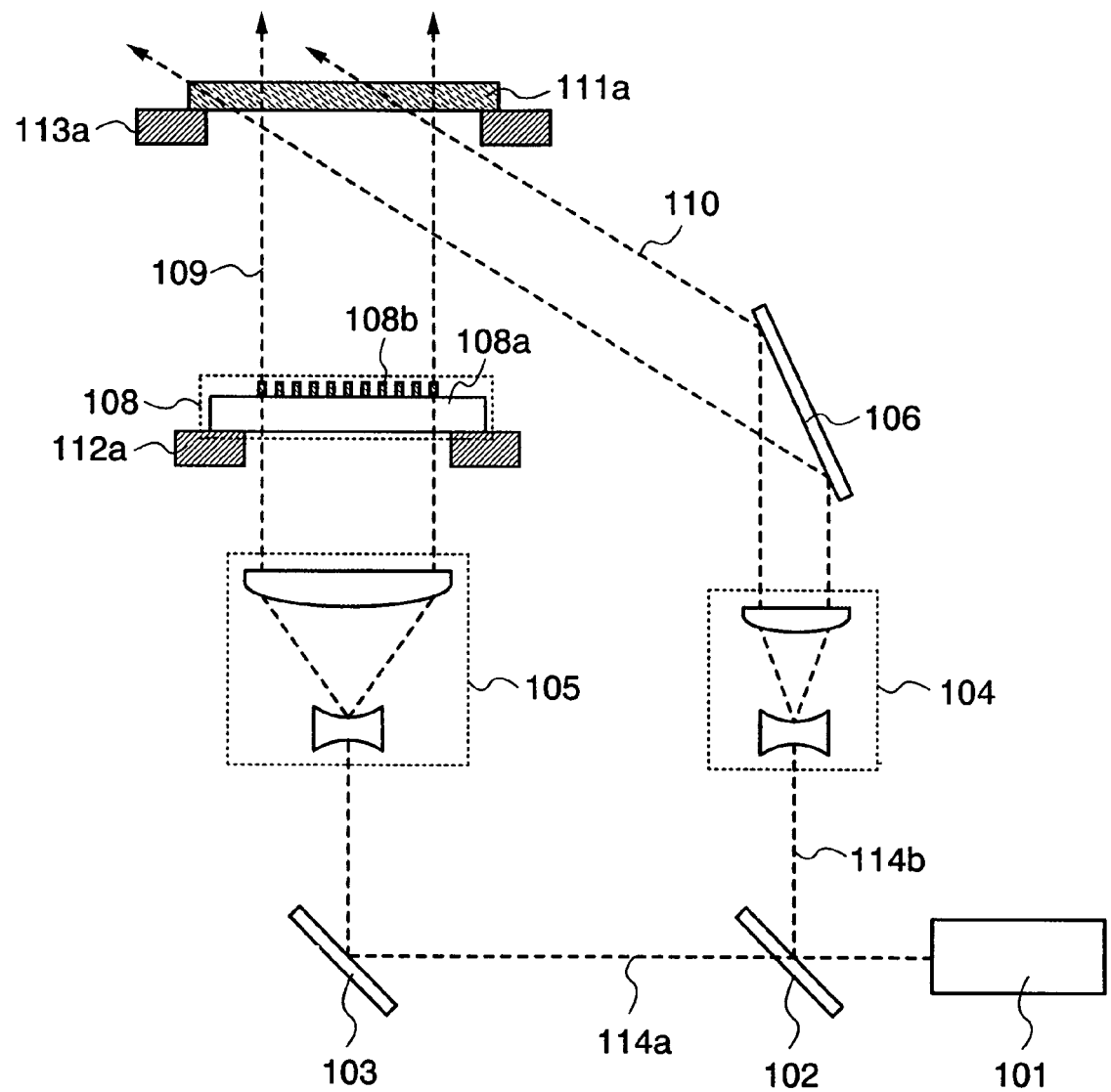
FIG. 1 illustrates an exemplary manufacturing method of the invention.

Embodiment modes of the invention will be described below with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiment modes. Note that in the structure of the invention described below, like reference numerals may be used to designate portions which are identical in different drawings.

Embodiment Mode 1

This embodiment mode will describe examples of a holographic exposure method of the invention, a holographic recording medium, and a method for manufacturing the holographic recording medium, with reference to the drawings.

FIG. 1 exemplarily illustrates an exposure system and an exposure method used in this embodiment mode.

The exposure system shown in FIG. 1 includes a laser oscillator 101, a beam splitter 102 for splitting a laser beam emitted from the laser oscillator 101, mirrors 103 and 106 for reflecting laser beams in desired directions, magnification optics 104 and 105 for magnifying beam spots of laser beams, and stages 112a and 113a.

The stages 112a and 113a are provided for positioning samples used in the exposure process, and the position of the stages 112a and 113a is adjustable in the vertical and horizontal directions. Here, an example is shown in which an original mask 108 is positioned on the stage 112a as a sample, and a holographic recording medium 111a is positioned on the stage 113a as a sample.

Next, the step of recording the pattern of the original mask 108 into the holographic recording medium 111a (the recording step), using the exposure system shown in FIG. 1 will be described.

A laser beam emitted from the laser oscillator 101 is split into laser beams at an appropriate intensity ratio by the beam splitter 102. Here, the laser beam is split into a first laser beam 114a and a second laser beam 114b. The beam spot of the first laser beam 114a is magnified by the magnification optics 105, and then the first laser beam 114a travels through the original mask 108 and is diffracted. Finally, the first laser beam 114a enters the holographic recording medium 111a as an object beam 109. Meanwhile, the beam spot of the second laser beam 114b is magnified by the magnification optics 104 and then the second laser beam 114 enters the holographic recording medium 111a as a reference beam 110.

In this manner, when the holographic recording medium 111a is illuminated with the object beam 109 and the reference beam 110 at the same time, a fringe pattern which contains information about the pattern of the original mask 108 is formed in the holographic recording medium 111a, and thus, a hologram recording medium is obtained. Note that the holographic recording medium 111a in which the pattern of the original mask 108 is formed as a fringe pattern is referred to as a holographic recording medium 111b (or simply referred to as a "hologram" or a "hologram mask" in some cases).

Next, an exemplary step of reconstructing the pattern of the original mask 108 (the reconstruction step) will be described with reference to FIG. 2, in which the holographic recording medium 111a having the fringe pattern (the holographic recording medium 111b) is illuminated with a laser beam, so that a laser beam which is diffracted by the holographic recording medium 111b is projected onto a resist.

The traveling direction of a laser beam 131 which is emitted from a laser oscillator 121 is changed by a mirror 123. Then, the beam spot of the laser beam 131 is magnified by magnification optics 124. After that, the traveling direction of the laser beam 131 is changed by mirrors 125 and 126, and the laser beam 131 finally enters the holographic recording medium 111b as a reconstruction reference beam 127. The reconstruction reference beam 127 which has entered the holographic recording medium 111b is diffracted by the fringe pattern of the holographic recording medium 111b, and a part of the diffraction rays enters, as a reconstruction beam 128, a resist 130 which is provided over an element formation substrate 129. After that, the resist is developed and a desired resist pattern can be obtained.

Note that here, the element formation substrate 129 is positioned on a stage 112b and the holographic recording medium 111b is positioned on a stage 113b. In addition, the reconstruction reference beam 127 is controlled to enter the holographic recording medium 111b from a direction opposite to the reference beam 110 shown in FIG. 1, and the resist 130 is disposed in the place where the original mask 108 shown in FIG. 1 was disposed.

Next, the original mask 108 and the holographic recording medium 111b which are used in the above exposure method will be described with reference to FIGS. 3A and 3B.

Figure 3A:
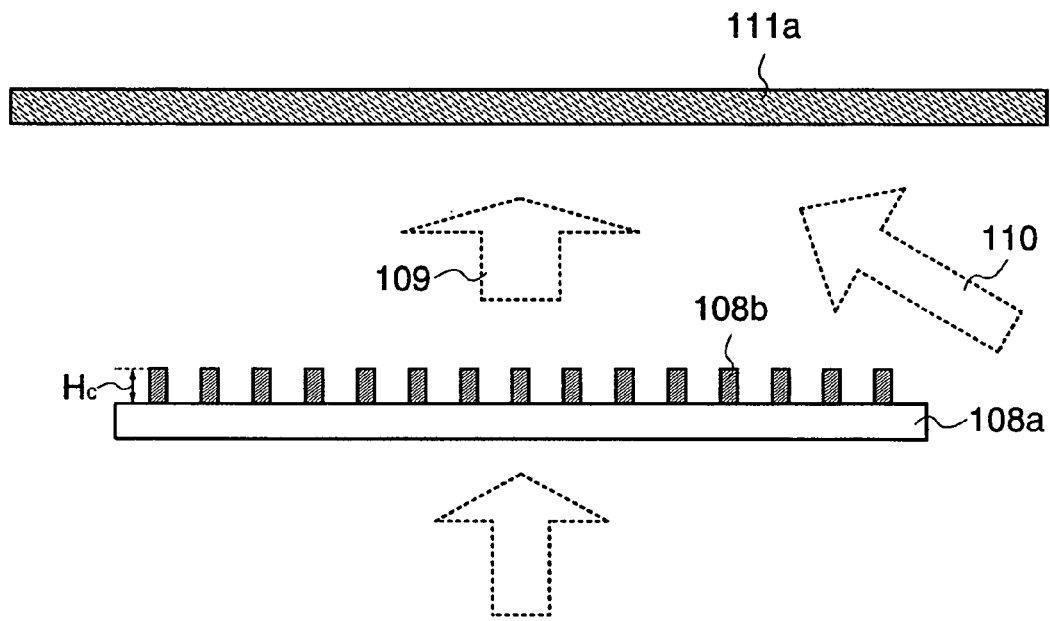
FIGS. 3A and 3B illustrate an exemplary manufacturing method of the invention.
Figure 3B:
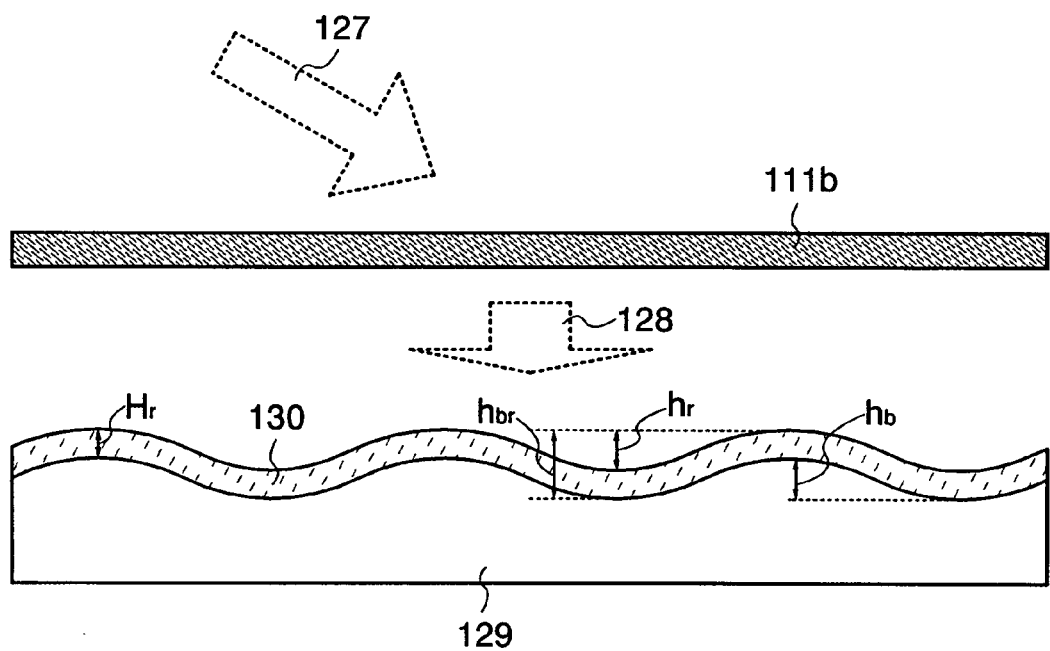

FIG. 3A illustrates an example where a fringe pattern is formed in the holographic recording medium 111a by using the original mask 108 which has a light-transmissive substrate 108a and a light-shielding film 108b selectively provided over the light-transmissive substrate 108a. The light-shielding film 108b has a thickness of $H_c$. FIG. 3B illustrates an example where the resist 130 formed over the element formation substrate 129 is exposed to light through the holographic recording medium 111a having the fringe pattern (the holographic recording medium 111b). Note that in FIGS. 3A and 3B, the surface of the element formation substrate 129 has a maximum difference in elevation of $h_b$, and the resist 130 having a thickness of $H_r$ is formed over the element formation substrate 129.

In this embodiment mode, as the original mask 108, a mask which is formed by taking into account the distortion or irregularities of the surface of the resist 130 that is to be exposed to light later is used. In FIGS. 3A and 3B, the thickness HC of the light-shielding film 108b of the original mask 108 is set larger than a maximum difference in elevation $h_r$ of the surface of the resist 130, or preferably set larger than a difference $h_{br}$ between the lowest position of the surface of the element formation substrate 129 and the highest position of the surface of the resist 130. For example, the thickness $H_c$ of the light-shielding film 108b is set in a range of 0.3 to 10 μm, inclusive.

Therefore, the holographic recording medium 111b is formed to have a fringe pattern (the pattern of the light-shielding film 108b) which has a thickness larger than the maximum difference in elevation $h_r$ of the surface of the resist 130 (or the difference $h_{br}$ between the lowest position of the surface of the element formation substrate 129 and the highest position of the surface of the resist 130). Note that the maximum difference in elevation $h_b$ of the surface of the element formation substrate 129, the maximum difference in elevation $h_r$ of the surface of the resist 130, and the like are preferably measured in advance before forming a fringe pattern in the holographic recording medium 111a.

Here, the maximum difference in elevation $h_b$ of the surface of the element formation substrate 129 means a difference between the highest portion and the lowest portion of the surface of the element formation substrate 129 in a direction perpendicular to the surface of the element formation substrate 129 within the range that an exposure object (which corresponds to the resist 130 provided over the element formation substrate 129) can be illuminated with the reconstruction beam 128 through the holographic recording medium 111b at a certain moment. The maximum difference in elevation of the surface can be measured with a laser interferometer, an AFM (Atomic Force Microscope), or the like.

For example, in the case where the entire surface of the resist 130 formed over the element formation substrate 129 is illuminated with the reconstruction beam 128 at a time in the reconstruction step, it is only necessary that the thickness of the light-shielding film 108b of the original mask 108b be determined by taking into account the distortion or irregularities of the entire element formation substrate 129 or the thickness of the resist 130. Alternatively, in the case where the resist 130 formed over the element formation substrate 129 is partly illuminated with the reconstruction beam 128 in the reconstruction step, it is only necessary that the thickness of the light-shielding film 108b of the original mask 108b be determined by taking into account the distortion or irregularities of the element formation substrate 129 in that region (in the range that the resist 130 can be illuminated with the reconstruction beam 128) or the thickness of the resist 130 in that range. As a further alternative, in the case where the resist 130 formed over the element formation substrate 129 is scanned and illuminated with a linear laser beam as the reconstruction beam 128 in one direction in the reconstruction step, it is only necessary that the thickness of the light-shielding film 108b of the original mask 108 be determined by taking into account the distortion or irregularities of the element formation substrate 129 in the range that the resist 130 can be illuminated with the linear laser beam at a certain moment (area dimensions of a shaped linear laser beam) or the thickness of the resist 130 in that range.

The maximum difference in elevation $h_r$ of the surface of the resist means a difference between the highest portion and the lowest portion of the surface of the resist 130 in a direction perpendicular to the surface of the element formation substrate 129 within the range that an exposure object (which corresponds to the resist 130 provided over the element formation substrate 129) can be illuminated with the reconstruction beam 128 through the holographic recording medium 111b at a certain moment.

In addition, the difference $h_{br}$ between the lowest position of the surface of the element formation substrate 129 and the highest position of the surface of the resist 130 means a difference between the lowest portion of the surface of the element formation substrate 129 and the highest portion of the surface of the resist 130 in a direction perpendicular to the surface of the element formation layer 129 within the range that an exposure object (which corresponds to the resist 130 provided over the element formation substrate 129) can be illuminated with the reconstruction beam 128 through the medium 111b at a certain moment.

Note that in the case where the resist 130 is formed to have a uniform thickness over the element formation substrate 129, the maximum difference in elevation $h_b$ of the surface of the element formation substrate 129 is equal to the maximum difference in elevation $h_r$ of the surface of the resist 130 ($h_b = h_r$). In addition, in the case where the maximum difference in elevation $h_b$ of the surface of the element formation substrate 129 is sufficiently larger than the thickness $H_r$ of the resist 130 ($H_r \ll h_b$), the difference $h_{br}$ between the lowest position of the surface of the element formation substrate 129 and the highest position of the surface of the resist 130 is approximately equal to the maximum difference in elevation $h_r$ of the surface of the resist 130 ($h_{br} \approx h_r$).

Next, the original mask, the laser oscillator, and the like which are used in the above exposure method will be described in detail.

As the substrate 108a, a glass substrate including a quartz substrate can be used.

As a material of the light-shielding film 108b, a thin-metal-film material such as chromium (Cr) or emulsion (photosensitive emulsion) can be used. When chromium is used as the material of the light-shielding film, a double-layer structure may be employed in which an interference film made of chromium oxide is deposited over the surface of a chromium film in order to lower the reflectivity of the surface. Emulsion is a material in which silver halide particles (photosensitive components) are dispersed in gelatin. As silver halide, silver bromide can be used.

As other materials of the light-shielding film, silicon, iron oxide, molybdenum silicide, and the like can be used. Further, a transparent inorganic or organic substance in which pigment or dye is dispersed can also be used. The light-shielding film 108b is preferably provided so as to have an optical density of not less than two, preferably, not less than three, or more preferably not less than five. Optical Density (OD) indicates the degree of opacity of a semi-transparent medium, which is represented by OD=−log(I'/I), where I is the intensity of incident light and I' is the intensity of light being transmitted.

When the light-shielding film 108b is provided to be thick using a thin-metal-film material such as chromium, there may be cases where the time and cost for forming the original mask increase. However, since the original mask having the light-shielding film 108b is used for forming a fringe pattern in the holographic recording medium, it is less frequently used compared with a mask used in a photolithography process; thus, the original mask having the light-shielding film 108b has an advantage in that it can be repeatedly used for a long time. In addition, the light-shielding film 108b formed over the substrate 108a is preferably formed to have a uniform thickness. In this case, the original mask can be formed more easily than the case where the light-shielding film 108b is formed to have various thicknesses in accordance with the distortion or irregularities of an exposure object.

As the holographic recording medium 111b, not only a mask whose fringe pattern is formed using the original mask, but also a computer-generated hologram whose fringe pattern is formed by computer-aided calculation can be used. A computer-generated hologram mask is obtained by the steps of calculating a fringe pattern instead of using an original mask, and directly printing the pattern into a holographic recording medium using an electron beam writing system or the like to form a fringe pattern. Using the computer-generated hologram is advantageous in that the original mask is not required.

As the laser oscillator 101 and the laser oscillator 121, a solid-state laser such as a YAG laser, a $YVO_4$ laser, a YLF laser, a $YAlO_3$ laser, or a $GdVO_4$ laser can be used. Specifically, a solid-state laser in which crystals such as YAG, $YVO_4$, YLF, $YAlO_3$, or $GdVO_4$ are doped with Cr, Nd, Er, Ho, Ce, Co, Ti, or Tm is used. Note that in the invention, the fundamental wave to the fifth harmonic of such solid-state laser oscillators are used as appropriate. The harmonics relative to the fundamental wave can be obtained by using a nonlinear optical element. For the laser oscillators 101 and 121, either the same laser oscillator or different laser oscillators may be used. In addition, the wavelength of the laser beams 114a and 114b which are emitted from the laser oscillator 101 and the wavelength of the laser beam 131 which is emitted from the laser oscillator 121 can be either the same or different.

Figure 2:
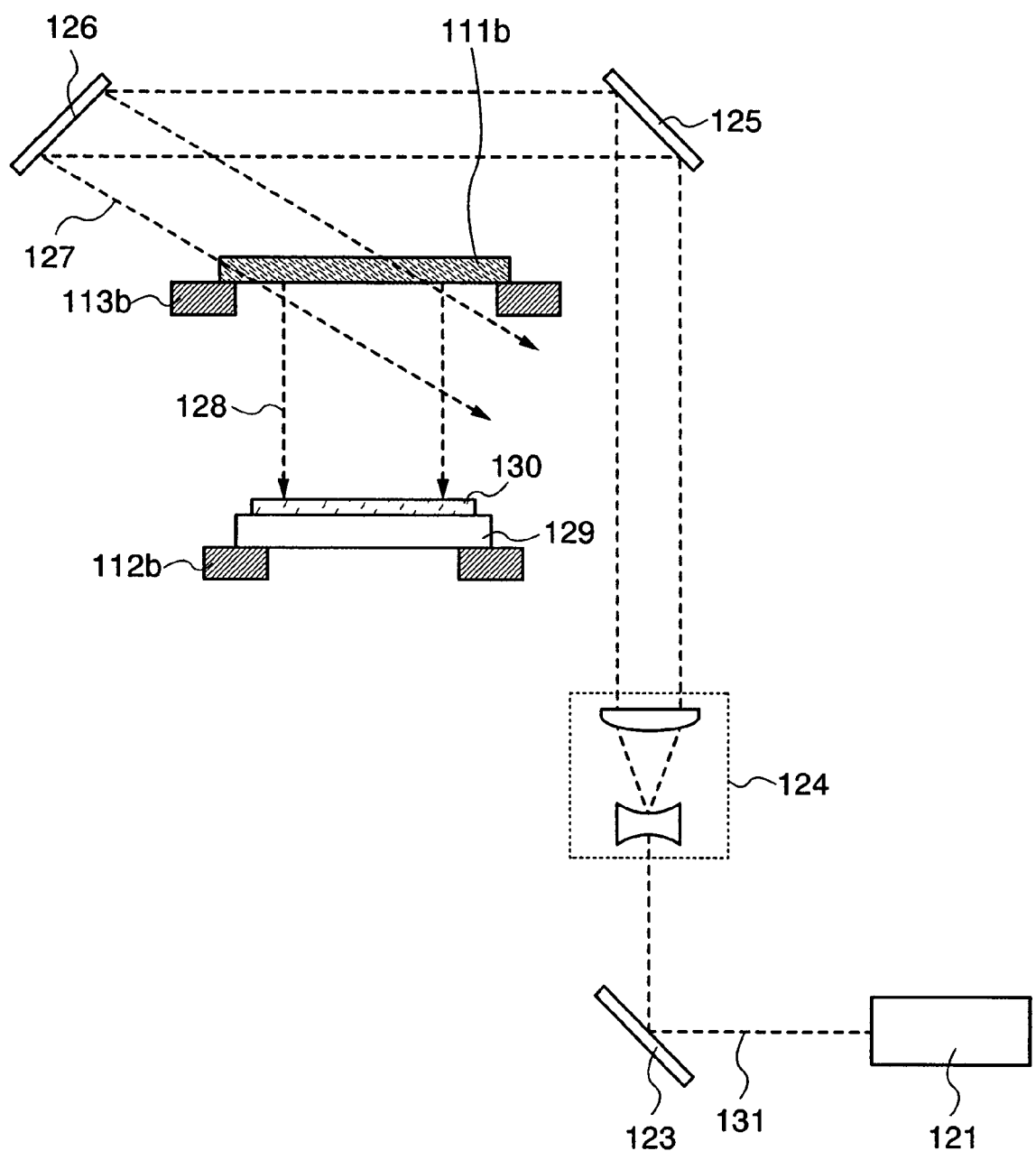
FIG. 2 illustrates an exemplary manufacturing method of the invention.

For example, in the reconstruction step shown in FIG. 2, a laser beam having a shorter wavelength than the first laser beam 114a and the second laser beam 114b which are used in the recording step shown in FIG. 1 can be used as the laser beam 131 which is used for illuminating the resist 130 through the holographic recording medium 111b. Further, a harmonic of the first laser beam 114a and the second laser beam 114b which are used in the recording step can be used as the laser beam 131 which is used in the reconstruction step. For example, the same kind of laser oscillator as or the same laser oscillator as the laser oscillator 101 which is used in the recording step may be used as the laser oscillator 121 which is used in the reconstruction step, and a laser beam emitted from the laser oscillator 121 can be converted into a harmonic using a nonlinear optical element. In addition, as the stage 112b and the stage 113b shown in FIG. 2, the stage 112a and the stage 113a used in the recording step shown in FIG. 1 can be used.

Specifically, in the recording step shown in FIG. 1, a YAG laser is used as the laser oscillator 101, and the fundamental wave (wavelength: 1064 nm) of the YAG laser is used as the first laser beam 114a and the second laser beam 114b. Meanwhile, in the reconstruction step shown in FIG. 2, a YAG laser is used as the laser oscillator 121, and a laser beam emitted from the laser oscillator 121 is converted into a harmonic with a nonlinear optical element, thereby obtaining the laser beam 131. As the laser beam 131, for example, the third harmonic (wavelength: 355 nm) of the YAG laser is used. In that case, the wavelengths of the first laser beam 114a and the second laser beam 114b which are used in the recording step are three times that of the laser beam 131 which is used in the reconstruction step. Thus, a pattern with a size ⅓ that of the pattern of the original mask 108 can be printed into the resist 130. Note that the laser oscillators are not limited to the YAG laser. As long as the same kind of laser oscillators are used for the laser oscillator 101 as for the laser oscillator 121, any of the above-described solid-state lasers can be used.

Alternatively, it is also possible to use the second harmonic (wavelength: 532 nm) of the YAG laser as the first laser beam 114a and the second laser beam 114b, and use the third harmonic (wavelength: 355 nm) of the YAG laser as the laser beam 131. In that case, the wavelengths of the first laser beam 114a and the second laser beam 114b which are used in the recording step are 1.5 times that of the laser beam 131 which is used in the reconstruction step. Thus, a pattern with a size 1/1.5 that of the pattern of the original mask 108 can be printed into the resist 130. In the case of using harmonics for the first laser beam 114a and the second laser beam 114b, a laser beam emitted from the laser oscillator 101 may be converted into a harmonic using a nonlinear optical element before it is split into the first laser beam 114a and the second laser beam 114b.

In this manner, in the holographic exposure method, the pattern of the original mask can be reduced in size and printed into the resist by setting the wavelength of the laser beam used in the recording step to be shorter than the wavelength of the laser beam used in the reconstruction step.

Although this embodiment mode has described the case of forming a resist over an element formation substrate, the element formation substrate is not limited to a particular substrate and can be any of a substrate, a conductive film for forming a wiring layer, an insulating film, a layer including semiconductor elements such as transistors, and the like. For example, the element formation substrate in this embodiment mode includes a transistor, an insulating film, and a conductive film that are sequentially stacked over a substrate. In this case, the maximum difference in elevation of the surface of the element formation substrate corresponds to a difference between the highest portion and the lowest portion of the layer formed in the outermost surface (here, the conductive film) within the range that the layer can be illuminated with a reconstruction beam.

In addition, although this embodiment mode has illustrated the case of using a transmission hologram, a reflection hologram may also be used. In the case of using a reflection hologram, for example, the incident directions of the reference beam 110 used in the recording step shown in FIG. 1 and the reconstruction reference beam 127 used in the reconstruction step shown in FIG. 2 may be reversed. Specifically, in the recording step, the reference beam 110 is controlled to enter the holographic recording medium 111a from a direction different from the incident direction of the object beam 109 (i.e., from the top-surface side of the holographic recording medium 111a in FIG. 1), while in the reconstruction step, the reconstruction reference beam 127 is controlled to enter from a direction opposite to the reference beam 110 (i.e., from the bottom-surface side of the holographic recording medium 111b in FIG. 2).

In this manner, the thickness of the light-shielding film of the original mask is determined by taking into account the distortion or irregularities of an exposure object, and the exposure object is illuminated with a laser beam through a holographic recording medium whose fringe pattern has been formed by using the original mask having the light-shielding film, whereby it becomes possible to reduce the adverse effects of the distortion or irregularities of the exposure object in the exposure process. Therefore, even when a pattern of a wiring layer is formed by using a holographic exposure method in the process of manufacturing a semiconductor device, it is possible to accurately illuminate a resist which is formed over the wiring layer, whereby the pattern can be formed and breaking of wirings and the like can be prevented. Further, even when an exposure method (reduction-projection exposure) is employed in which laser beams with different wavelengths are used in the recording step and the reconstruction step so that the original pattern is reduced more in size and printed into the resist, a resist pattern can be accurately formed.

Note that this embodiment mode can be freely combined with other embodiment modes in this specification.

Embodiment Mode 3

In the reconstruction step shown in the preceding embodiment modes, in the case where the resist 130 formed over the element formation substrate 129 is scanned and illuminated with a linear laser beam as the reconstruction beam 128 in one direction, an autofocusing method may be used. The case of using an autofocusing method will be described below with reference to FIGS. 4A and 4B. Note that here, description will be made of the case where the surface of the element formation substrate 129 is rectangular, the short side and long side of which are parallel with the X-axis direction and the Y-axis direction, respectively. In addition, FIG. 4A shows a top view of the exposure object (here, the resist 130 formed over element formation substrate 129), and FIG. 4B shows a cross-sectional view of the exposure object in FIG. 4A.

Figure 4A:
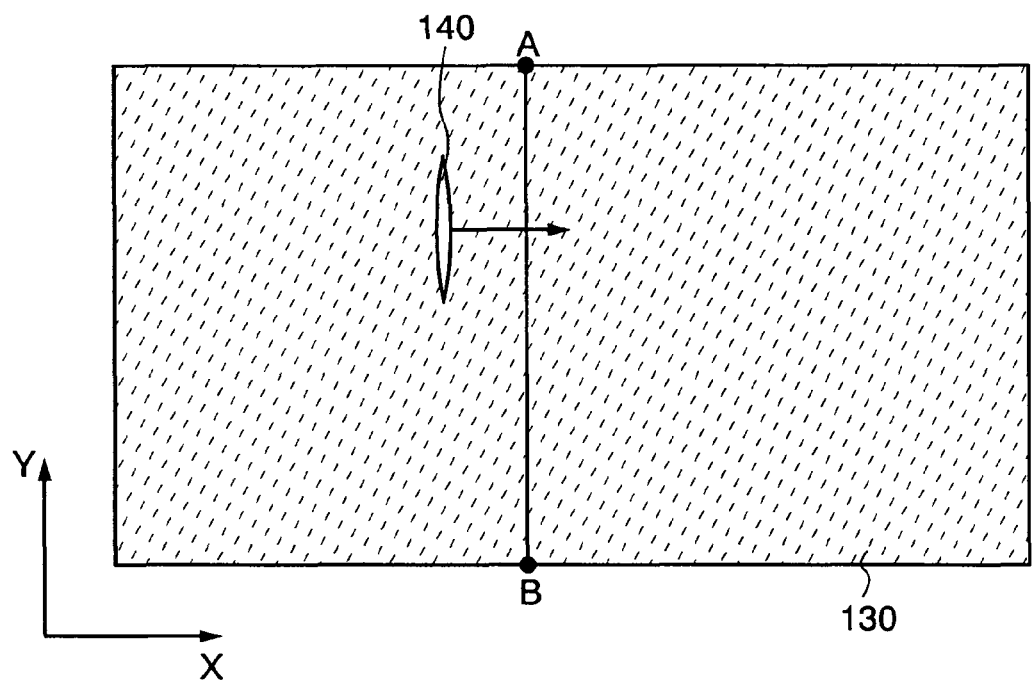
FIGS. 4A and 4B illustrate an exemplary manufacturing method of the invention.
Figure 4B:
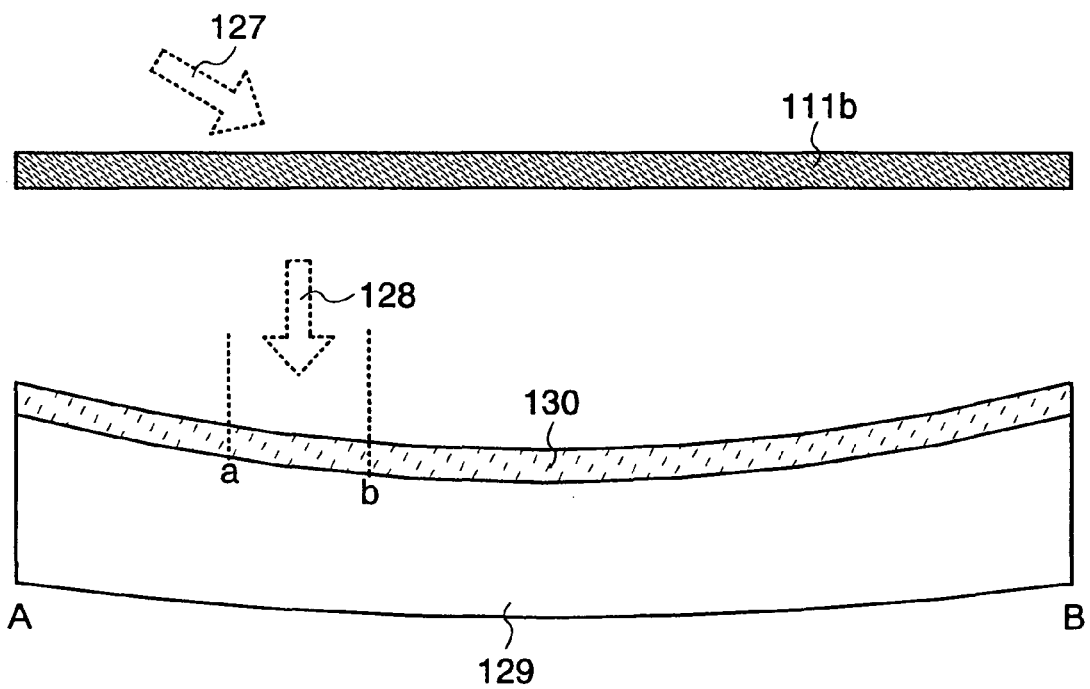

In this embodiment mode, a case is shown in which the resist 130 is scanned and illuminated in the X-axis direction with a linear laser beam 140 having a long axis and a short axis (FIG. 4A). Note that when the resist 130 is illuminated with the laser beam 140 such that the short-axis direction of the linear laser beam 140 is in parallel with the X-axis direction, laser irradiation can be efficiently performed. In addition, in this embodiment mode, an autofocusing method is used in the case where the resist 130 is scanned with the laser beam 140 in the direction parallel with the X-axis direction.

An autofocusing method is a method in which the focus of a laser beam which is shone on the exposure object is automatically adjusted to the exposure object, whereby the gap between the surface of the element formation substrate 129 and the holographic recording medium 111b can be maintained constant when illuminating the resist 130 with the laser beam 140.

By illuminating the exposure object with the linear laser beam 140 using the autofocusing method, adverse effects of the distortion or irregularities of the rectangular element formation substrate 129 in one direction (here, the X-axis direction) can be reduced. Therefore, when the exposure object is exposed to light through the holographic recording medium 111b, it is only necessary to take into consideration the adverse effects of the distortion or irregularities of the element formation substrate 129 in the other direction within the range that it is illuminated with the laser beam 140 (here, the Y-axis direction; a region between a and b in FIG. 4B). In addition, in the case of using the autofocusing method, when the laser scan direction is set equal to a direction of the element formation substrate 129 which has larger distortion or irregularities of the X-axis direction and the Y-axis direction (here, the X-axis direction), it becomes possible to further reduce the adverse effects of the distortion or irregularities of the element formation substrate 129 when exposing the exposure object to light through the holographic recording medium 111b.

For example, when a glass substrate with a thickness of 0.7 mm and "X"×"Y"=600 mm×720 mm was placed on a stage and the distortion of the glass substrate was measured, it was confirmed that a maximum difference in elevation per 10 cm in one direction was 7.4 µm/10 cm in the X-axis direction and 4.8 µm/10 cm in the Y-axis direction. In addition, when the maximum difference in elevation of only the glass substrate was measured, it was confirmed that 3.5 µm/10 cm in the X-axis direction and 1.6 µm/10 cm in the Y-axis direction.

Therefore, the above-described glass substrate having distortion may be scanned and illuminated with a laser beam (as a reconstruction beam) in a direction parallel with the X-axis direction, and it is only necessary to take into account the distortion of the glass substrate in the Y-axis direction which is parallel with the long-axis direction of the laser beam. For example, when the glass substrate is scanned in the X-axis direction with the linear laser beam 140 having a long axis of 10 cm, the thickness of the light-shielding film of the original mask may be determined by taking into account the distortion or irregularities of the glass substrate in a range of 10 cm in the Y-axis direction as shown in Embodiment Mode 1 (here, 1.6 µm (or 4.8 µm when the glass substrate is placed on the stage). On the other hand, the adverse effects of the distortion or irregularities of the substrate in the X-axis direction can be reduced by an autofocusing method.

In this manner, when the exposure object is scanned and illuminated with a linear laser beam (as a reconstruction beam) in one direction in the reconstruction step, adverse effects of the distortion or irregularities of the element formation substrate in the scan direction of the linear laser beam can be reduced by using a autofocusing method. Further, since the autofocusing method can reduce the adverse effects of the distortion or irregularities of the element formation substrate in the laser scan direction, the exposure process can be performed by using an original mask having a thinner light-shielding film.

Note that this embodiment mode can be freely combined with other embodiment modes in this specification.

Embodiment Mode 3

This embodiment mode will describe an exposure method which differs from those of the preceding embodiment modes. Specifically, an exposure method using total internal reflection holography with a prism will be described.

Figure 5:
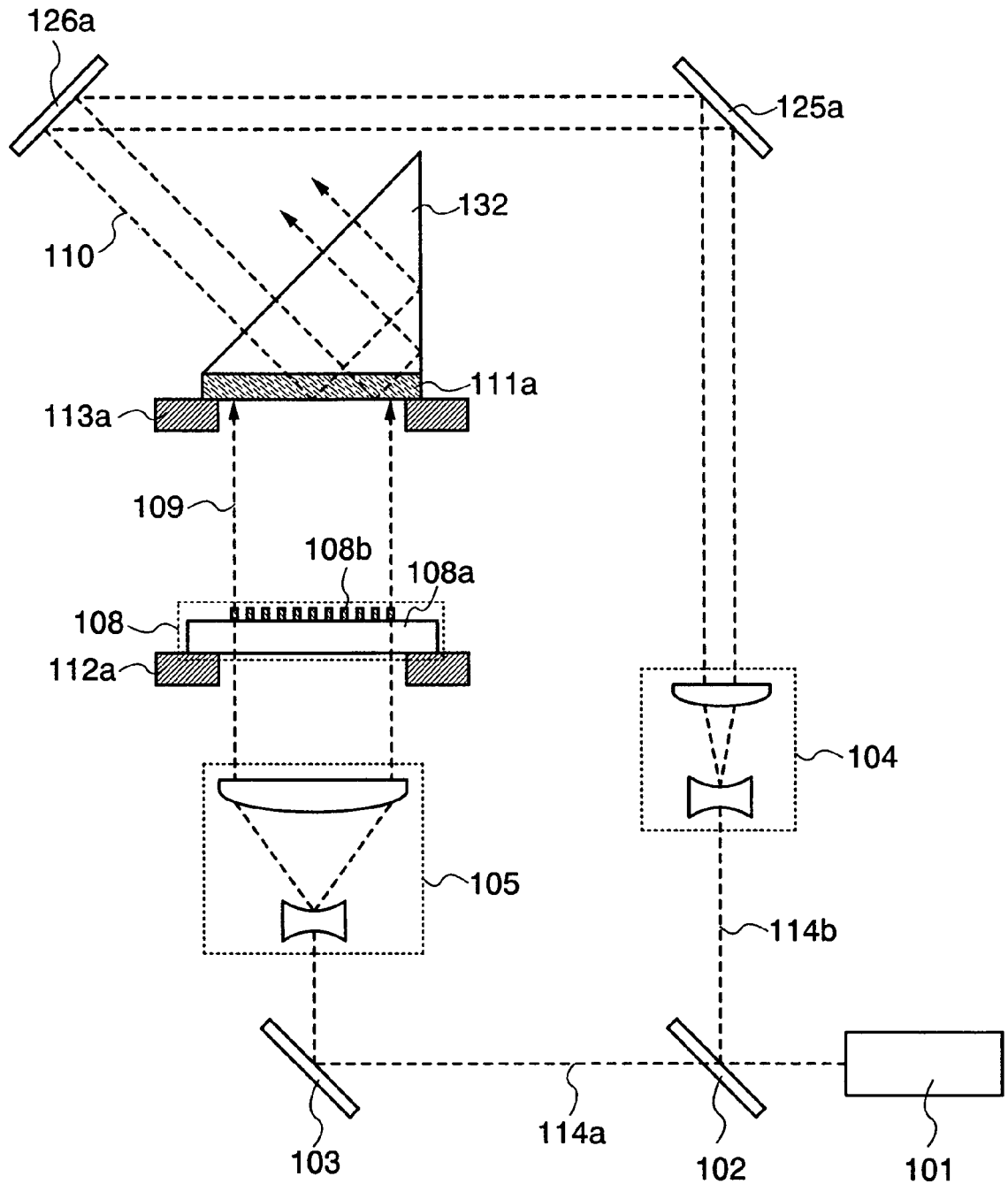
FIG. 5 illustrates an exemplary manufacturing method of the invention.

FIG. 5 shows an exposure system used in the step of recording a pattern of the original mask into a holographic recording medium (the recording step).

The exposure system shown in FIG. 5 includes a laser oscillator 101, a beam splitter 102 for splitting a laser beam emitted from the laser oscillator 101, mirrors 103, 125a, and 126a for reflecting laser beams in desired directions, magnification optics 104 and 105 for magnifying beam spots of laser beams, and stages 112a and 113a.

The stages 112a and 113a are provided for positioning samples used in the exposure process, and the position of the stages 112a and 113a is adjustable in the vertical and horizontal directions. In the example shown herein, an original mask 108 is positioned on the stage 112a, and a holographic recording medium 111a which is fixed on a prism 132 is positioned on the stage 113a.

Next, the step of recording the pattern of the original mask 108 into the holographic recording medium 111a fixed on the prism 132 (the recording step), using the exposure system shown in FIG. 5 will be described.

A laser beam emitted from the laser oscillator 101 is split into laser beams at an appropriate intensity ratio by the beam splitter 102. Here, the laser beam is split into a first laser beam 114a and a second laser beam 114b. The beam spot of the first laser beam 114a is magnified by the magnification optics 105. Then, the first laser beam 114a is diffracted by the original mask 108 and finally enters the holographic recording medium 111a as an object beam 109. Meanwhile, the beam spot of the second laser beam 114b is magnified by the magnification optics 104, and then the traveling direction of the second laser beam 114b is changed by the mirrors 125a and 126a. Finally, the second laser beam 114b enters the holographic recording medium 111a as a reference beam 110. Here, the reference beam 110 is totally reflected at a boundary between the holographic recording medium 111a and the atmosphere, and travels through the prism 132.

In this manner, when the holographic recording medium 111a is illuminated with the object beam 109 and the reference beam 110 at the same time, a fringe pattern which contains information about the pattern of the original mask 108 is formed in the holographic recording medium 111a.

As the laser oscillator 101, a solid-state laser such as a YAG laser, a $YVO_4$ laser, a YLF laser, a $YAlO_3$ laser, or a $GdVO_4$ laser can be used. Specifically, a solid-state laser in which crystals such as YAG, $YVO_4$, YLF, $YAlO_3$, or $GdVO_4$ are doped with Cr, Nd, Er, Ho, Ce, Co, Ti, or Tm is used. Note that in the invention, the fundamental wave to the fifth harmonic of such solid-state laser oscillators are used as appropriate. The harmonics relative to the fundamental wave can be obtained by using a nonlinear optical element.

Figure 6:
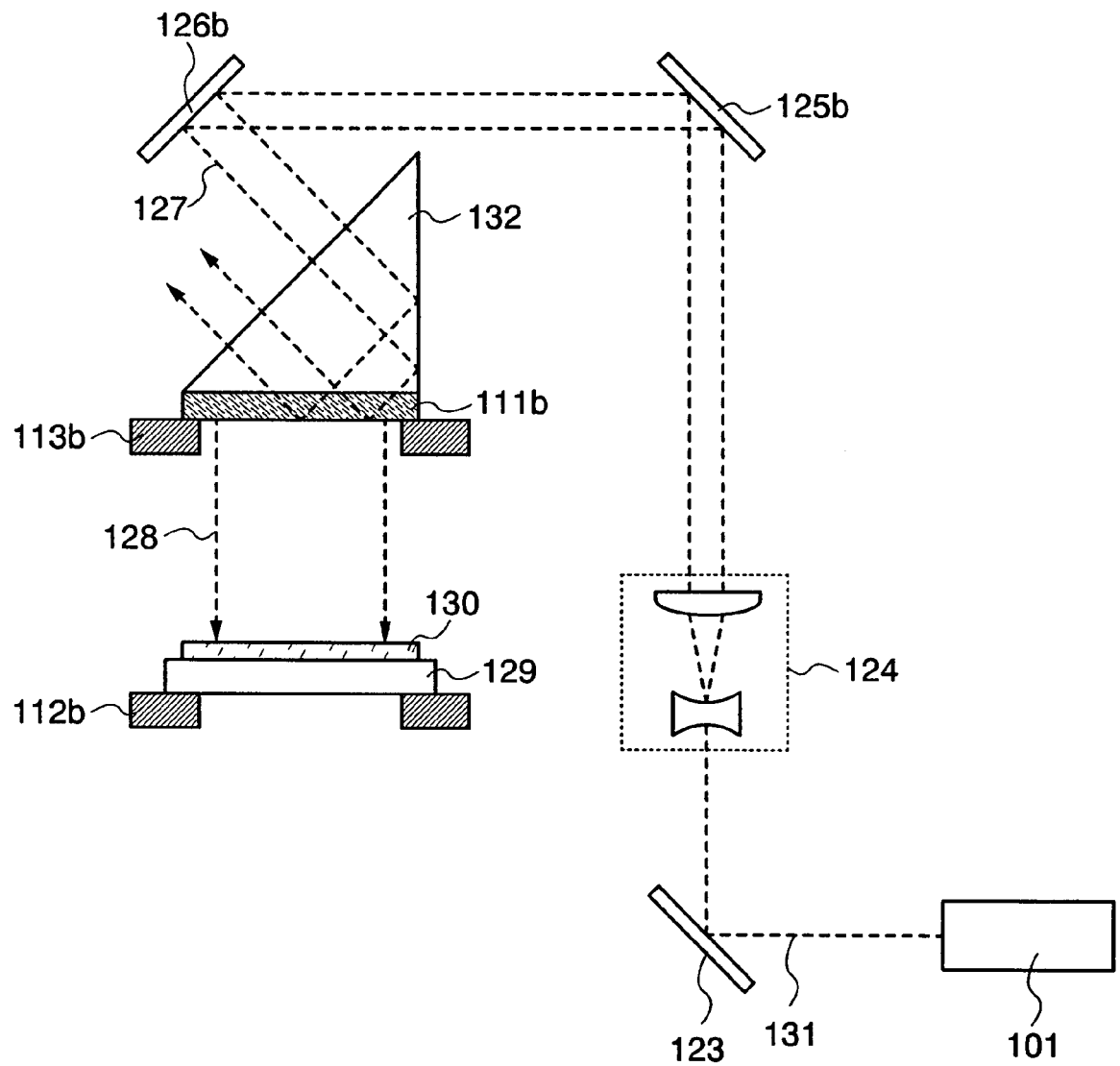
FIG. 6 illustrates an exemplary manufacturing method of the invention.

Next, FIG. 6 shows an exemplary step of reconstructing the hologram recorded in the holographic recording medium 111a which is formed in FIG. 5 by printing a holographic image into a resist (the reconstruction step).

The traveling direction of a laser beam 131 which is emitted from a laser oscillator 121 is changed by a mirror 123. Then, the beam spot of the laser beam 131 is magnified by magnification optics 124. After that, the traveling direction of the laser beam 131 is changed by the mirrors 125a and 126a, and finally the laser beam 131 enters the holographic recording medium 111b as a reconstruction reference beam 127 through the prism 132. The reconstruction reference beam 127 which has entered the holographic recording medium 111b is diffracted by the fringe pattern of the holographic recording medium 111b, and a part of the diffraction rays enters, as a reconstruction beam 128, a resist 130 which is provided over an element formation substrate 129. Note that the magnification optics 124 and the mirrors 125a and 126b shown in FIG. 6 can be the same as the magnification optics 104 and the mirrors 125a and 126a shown in FIG. 5.

Note also that here, the element formation substrate 129 is positioned on a stage 112b and the holographic recording medium 111b is positioned on a stage 113b. In addition, the reconstruction reference beam 127 is controlled to enter the holographic recording medium 111b through the prism 132 from a direction opposite to the reference beam 110 shown in FIG. 5, and the resist 130 is disposed in the place where the original mask 108 shown in FIG. 5 was disposed.

The original mask 108 used in this embodiment mode can be similar to the one shown in Embodiment Mode 1.

In this manner, the thickness of the light-shielding film of the original mask is determined by taking into account the distortion or irregularities of an exposure object, and the exposure object is illuminated with a laser beam through a holographic recording medium whose fringe pattern has been formed by using the original mask having the light-shielding film, whereby it becomes possible to reduce the adverse effects of the distortion or irregularities of the exposure object in the exposure process. Therefore, even when a pattern of a wiring layer is formed by using a holographic exposure method in the process of manufacturing a semiconductor device, it is possible to accurately illuminate a resist which is formed over the wiring layer, whereby the pattern can be formed and breaking of wirings and the like can be prevented. Further, even when an exposure method (reduction-projection exposure) is employed in which laser beams with different wavelengths are used in the recording step and the reconstruction step so that the original pattern is reduced more in size and printed into the resist, a resist pattern can be accurately formed.

Figure 17:
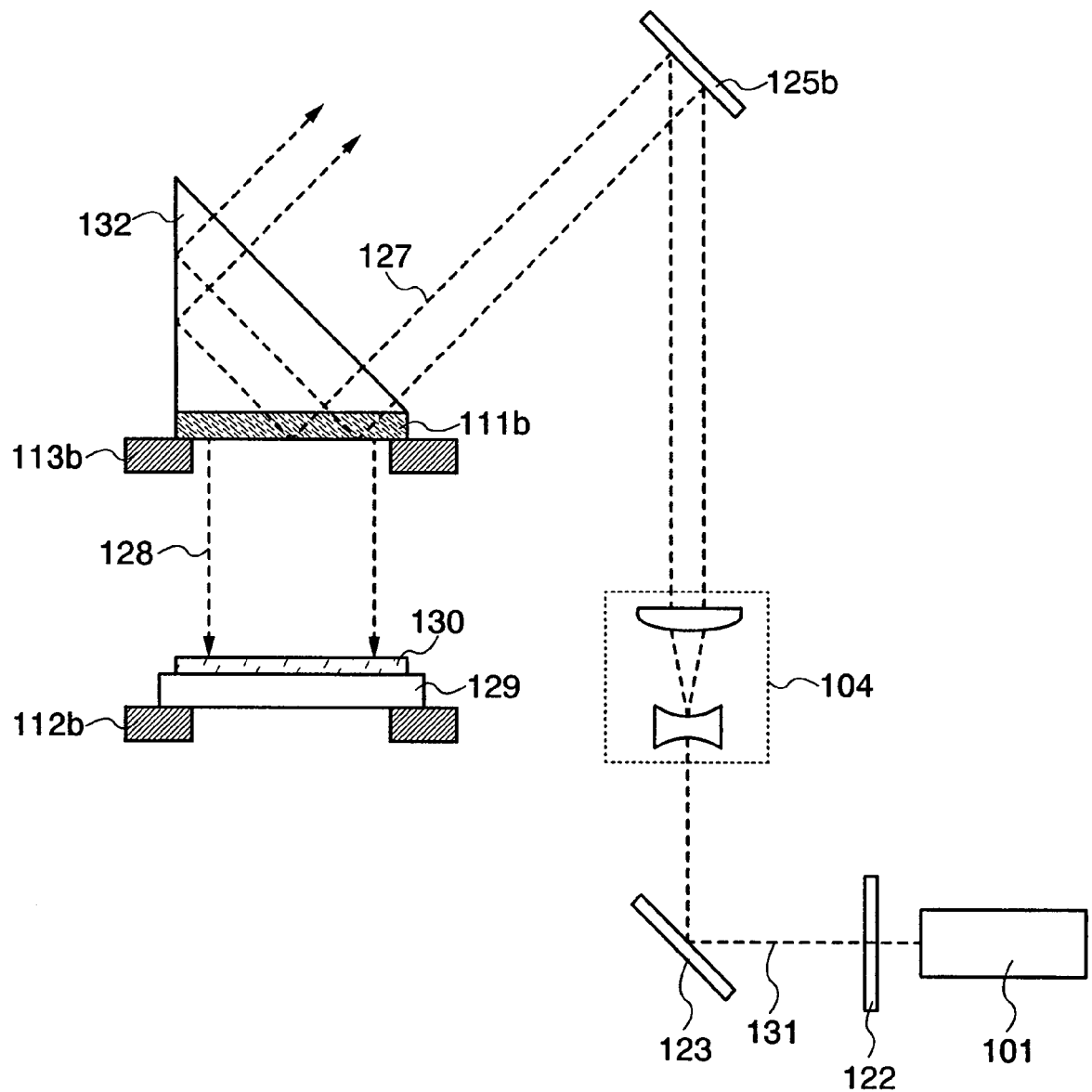
FIG. 17 illustrates an exemplary manufacturing method of the invention.

Note that in this embodiment mode, the same system can be used in the recording step and the reconstruction step. In this case, the reconstruction step can be performed by rotating the holographic recording medium 111b by 180 degrees or rotating the prism 132 used in the recording step by 180 degrees (see FIG. 17). Further, this embodiment mode can be freely combined with other embodiment modes in this specification. For example, autofocusing shown in Embodiment Mode 2 may be used.

Embodiment Mode 4

This embodiment mode will describe an exposure method which differs from those of the preceding embodiment modes, with reference to the drawings. Specifically, a holographic exposure method in which the recording step and the reconstruction step are performed by using the same laser oscillator and the same exposure system will be described.

Figure 15:
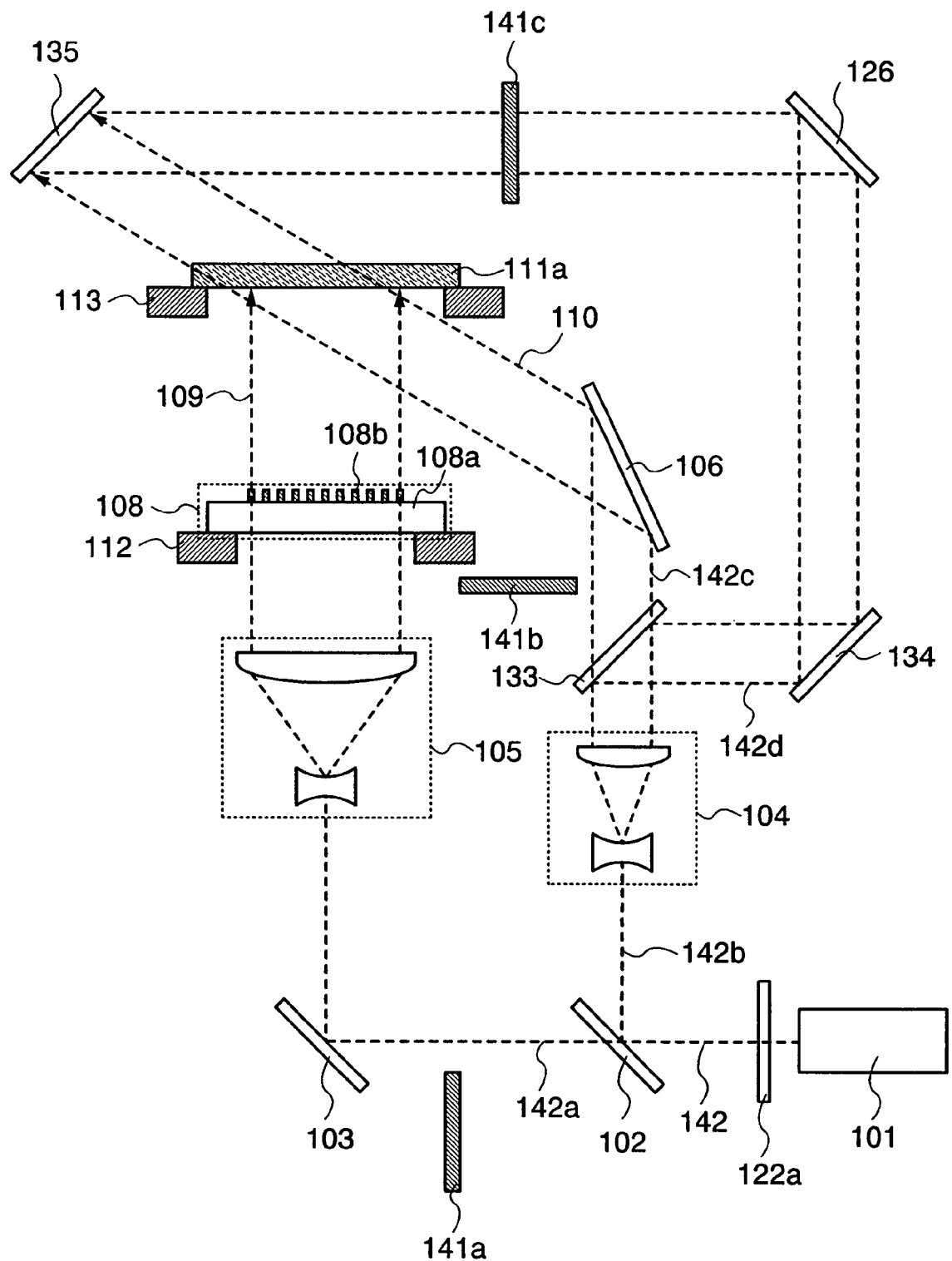
FIG. 15 illustrates an exemplary manufacturing method of the invention.

FIG. 15 exemplarily illustrates an exposure system used in this embodiment mode.

The exposure system shown in FIG. 15 includes a laser oscillator 101, a nonlinear optical element 122a which converts a laser beam emitted from the laser oscillator 101 into a harmonic, beam splitters 102 and 133 which split laser beams, mirrors 103, 106, 126, 134, and 135 which reflect laser beams in desired directions, magnification optics 104 and 105 which magnify beam spots of laser beams, stages 112 and 113, and shutters 141a to 141c which block laser beams.

The stages 112 and 113 are provided for positioning samples used in the exposure process, and the position of the stages 112 and 113 is adjustable in the vertical and horizontal directions. In the example shown herein, an original mask 108 is positioned on the stage 112, and a holographic recording medium 111a is positioned on the stage 113.

The shutters 141a to 141c are formed from materials which can block laser beams, and laser beams can be selectively blocked by opening or closing the shutters 141a to 141c.

Next, the step of recording the pattern of the original mask 108 into the holographic recording medium 111a (the recording step) will be described.

A laser beam emitted from the laser oscillator 101 is converted into a harmonic by the nonlinear optical element 122a to become a laser beam 142. Next, the laser beam 142 is split into laser beams at an appropriate intensity ratio by the beam splitter 102. Here, the laser beam is split into a first laser beam 142a and a second laser beam 142b. Note that in the case of using the fundamental wave in the recording step, the laser beam is controlled to directly enter the beam splitter 102 without passing through the nonlinear optical element 122a.

The beam spot of the first laser beam 142a is magnified by the magnification optics 105. Then, the first laser beam 142a is diffracted by the original mask 108 and finally enters the holographic recording medium 111a as an object beam 109. Meanwhile, the beam spot of the second laser beam 142b is magnified by the magnification optics 104, and then the second laser beam 142b is split into a third laser beam 142c and a fourth laser beam 142d by the beam splitter 133. The traveling direction of the third laser beam 142c is changed by the mirror 106, and then the third laser beam 142c enters the holographic recording medium 111a as a reference beam 110. The traveling direction of the fourth laser beam 142d is changed by the mirrors 134 and 126, and then the fourth laser beam 142d is blocked by the shutter 141c. In this embodiment mode, the beam splitter 133 may be a mirror which does not block the optical path during the recording step.

In this manner, when the holographic recording medium 111a is illuminated with the object beam 109 and the reference beam 110 at the same time, a fringe pattern that is produced by optical interference between the object beam 109 and the reference beam 110 is formed in the holographic recording medium 111a. That is, a hologram having the pattern of the original mask 108 is recorded in the holographic recording medium 111a.

Note that in the recording step, the shutter 141a and shutter 141b are in the open position (the state in which laser beams are not blocked), while the shutter 141c is in the closed position (the state in which laser beams are blocked).

Figure 16:
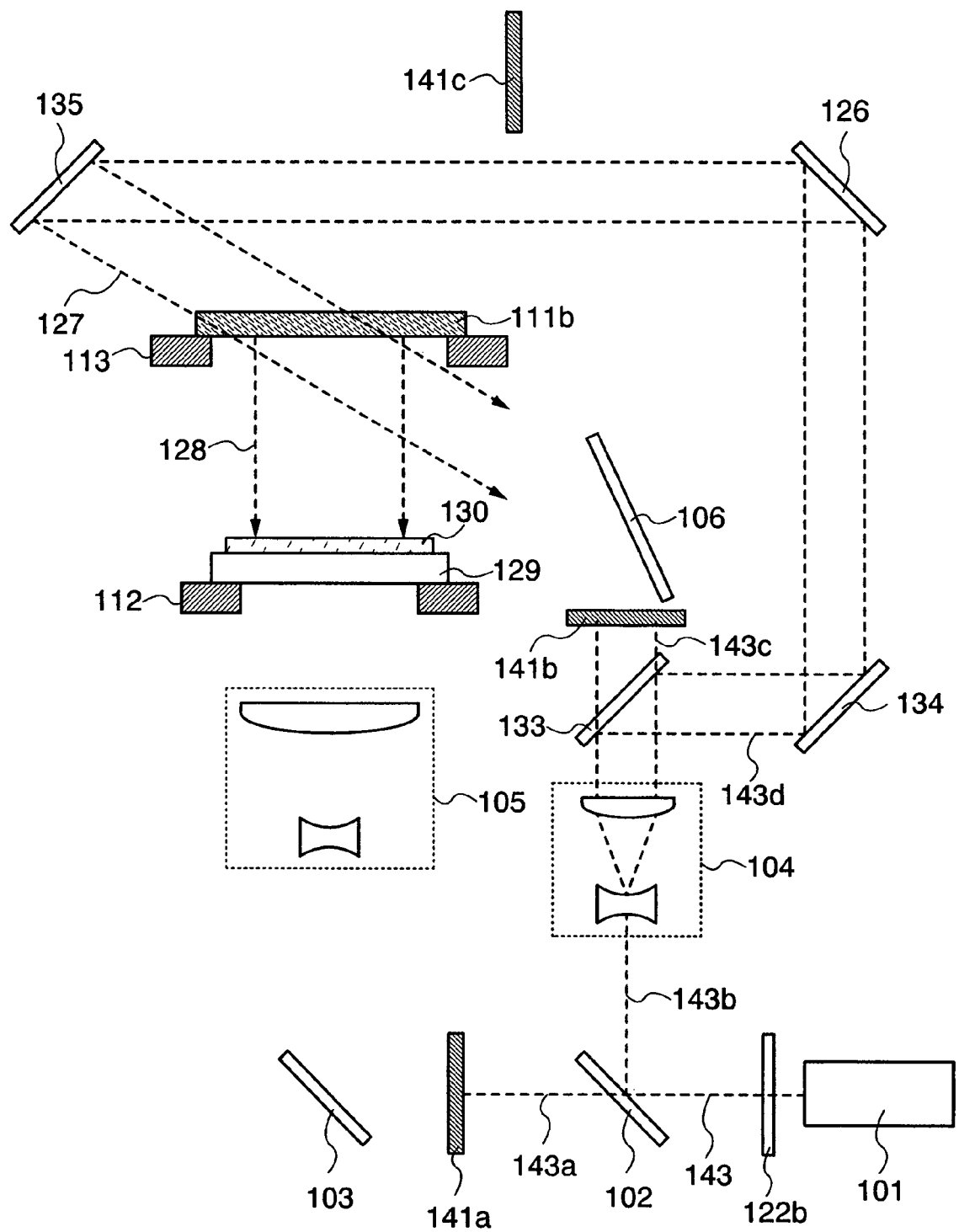
FIG. 16 illustrates an exemplary manufacturing method of the invention.

Next, FIG. 16 shows an exemplary step of reconstructing the hologram recorded in the holographic recording medium 111a which is formed in FIG. 15 by printing a holographic image into a resist (the reconstruction step).

A laser beam emitted from the laser oscillator 101 which is used in the recording step in FIG. 15 is converted into a harmonic by a nonlinear optical element 122b to become a laser beam 143. The laser beam 143 is converted into the harmonic so that it has a shorter wavelength than the laser beam 142 used in the recording step. Next, the laser beam 143 is split into laser beams at an appropriate intensity ratio by the beam splitter 102. Here, the laser beam is split into a fifth laser beam 143a and a sixth laser beam 143b. The wavelength of the laser beam 143 is set equal to or shorter than the wavelength of the laser beam 142.

Then, the fifth laser beam 143a is blocked by the shutter 141a. The beam spot of the sixth laser beam 143b is magnified by the magnification optics 104, and then the sixth laser beam 143b is split into a seventh laser beam 143c and an eighth laser beam 143d by the beam splitter 133. The seventh laser beam 143c is blocked by the shutter 141b. Meanwhile, the traveling direction of the eighth laser beam 143d is changed by the mirrors 134, 126, and 135, and then the eighth laser beam 143d enters the holographic recording medium 111b as a reconstruction reference beam 127. The reconstruction reference beam 127 which has entered the holographic recording medium 111b is diffracted by the fringe pattern of the holographic recording medium 111b, and a part of the diffraction rays enters, as a reconstruction beam 128, a resist 130 which is provided over an element formation substrate 129. Note that here, the resist 130 is positioned on the stage 112, and the holographic recording medium 111b having the fringe pattern is positioned on the state 113. In addition, the reconstruction reference beam 127 is controlled to enter the holographic recording medium 111b from a direction opposite to the reference beam 110 shown in FIG. 15, and the resist 130 is disposed in the place where the original mask 108 shown in FIG. 15 was disposed.

Note that in the reconstruction step, the shutter 141a and the shutter 141b are in the open position (the state in which laser beams are not blocked), while the shutter 141c is in the closed position (the state in which laser beams are blocked).

In this manner, providing the shutters 141a to 141c enables a holographic exposure method in which the same laser oscillator and the same exposure system are used in the recording step and the reconstruction step. In addition, in this embodiment mode, the original mask used in the recording step and the resist used in the reconstruction step are positioned on the same state, and further, the position of the holographic recording medium 111b is not changed. Therefore, adverse effects of distortion or irregularities of the exposure object which depends on the roughness or irregularities of the stage can be reduced. Note that this embodiment mode can be freely combined with other embodiment modes in this specification.

Embodiment Mode 5

This embodiment mode will describe a method for manufacturing a semiconductor device using the exposure method shown in the above embodiment modes, with reference to the drawings. Note that in this embodiment mode, although a cell of a static random access memory (SRAM) which includes six transistors is exemplarily shown, the invention is not limited to this.

Figure 7:
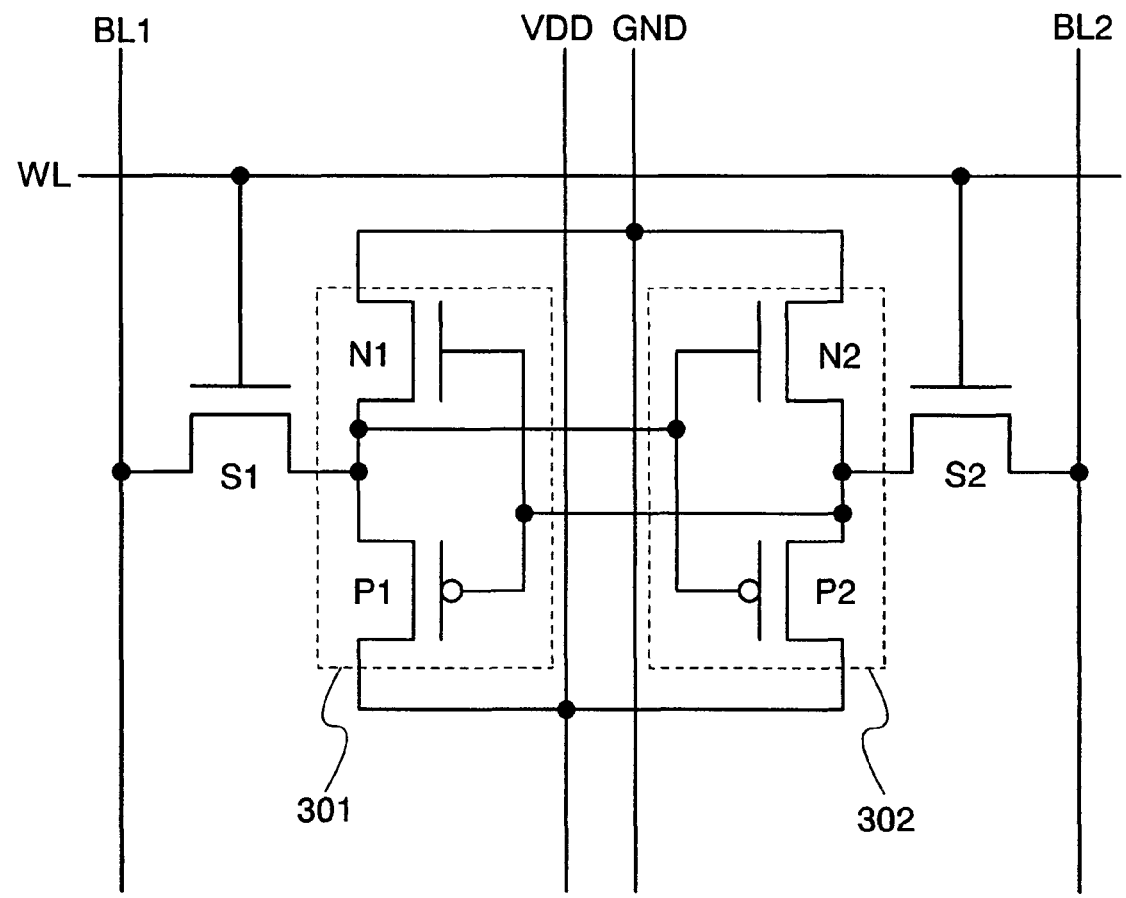
FIG. 7 illustrates a semiconductor device.

The SRAM shown in this embodiment mode includes inverters 301 and 302, and the inputs of the inverters 301 and 302 are connected to bit lines BL1 and BL2 through switches S1 and S2, respectively (FIG. 7). The switches S1 and S2 are controlled by a row selection signal which is transmitted through a word line WL. Each of the inverters 301 and 302 is supplied with power by a high voltage VDD and a low voltage GND which is generally grounded. In order to write data into the memory cell, the voltage VDD is applied to one of the bit lines BL1 and BL2, while the voltage GND is applied to the other of the bit lines BL1 and BL2.

The inverter 301 includes an n-channel transistor N1 and a p-channel transistor P1 connected in series. The source of the p-channel transistor P1 is connected to the voltage VDD, and the source of the n-channel transistor N1 is connected to the voltage GND. The drains of the p-channel transistor P1 and the n-channel transistor N1 are connected to each other, and the gates of the p-channel transistor P1 and the n-channel transistor N1 are also connected to each other. Similarly, the inverter 302 includes a p-channel transistor P2 and an n-channel transistor N2 which are connected in series similarly to the p-channel transistor P1 and the n-channel transistor N1. The drains of the p-channel transistor P2 and the n-channel transistor N2 are connected to each other, and the gates of the p-channel transistor P2 and the n-channel transistor N2 are also connected to each other.

The SRAM shown in FIG. 7 operates in such a way that the switches S1 and S2 are turned on to set the input/output states of the inverters 301 and 302. Next, when the switches S1 and S2 are turned off, the signal states of the inverters 301 and 302 are retained. In order to read out data from the memory cell, each of the bit lines BL1 and BL2 is precharged to be in the voltage range from VDD to GND. When the switches S1 and S2 are turned on, voltages of the bit lines change in accordance with the signal states of the inverters 301 and 302. Data stored in the memory cell is read out by a sense amplifier which is connected to each bit line.

Figure 8:
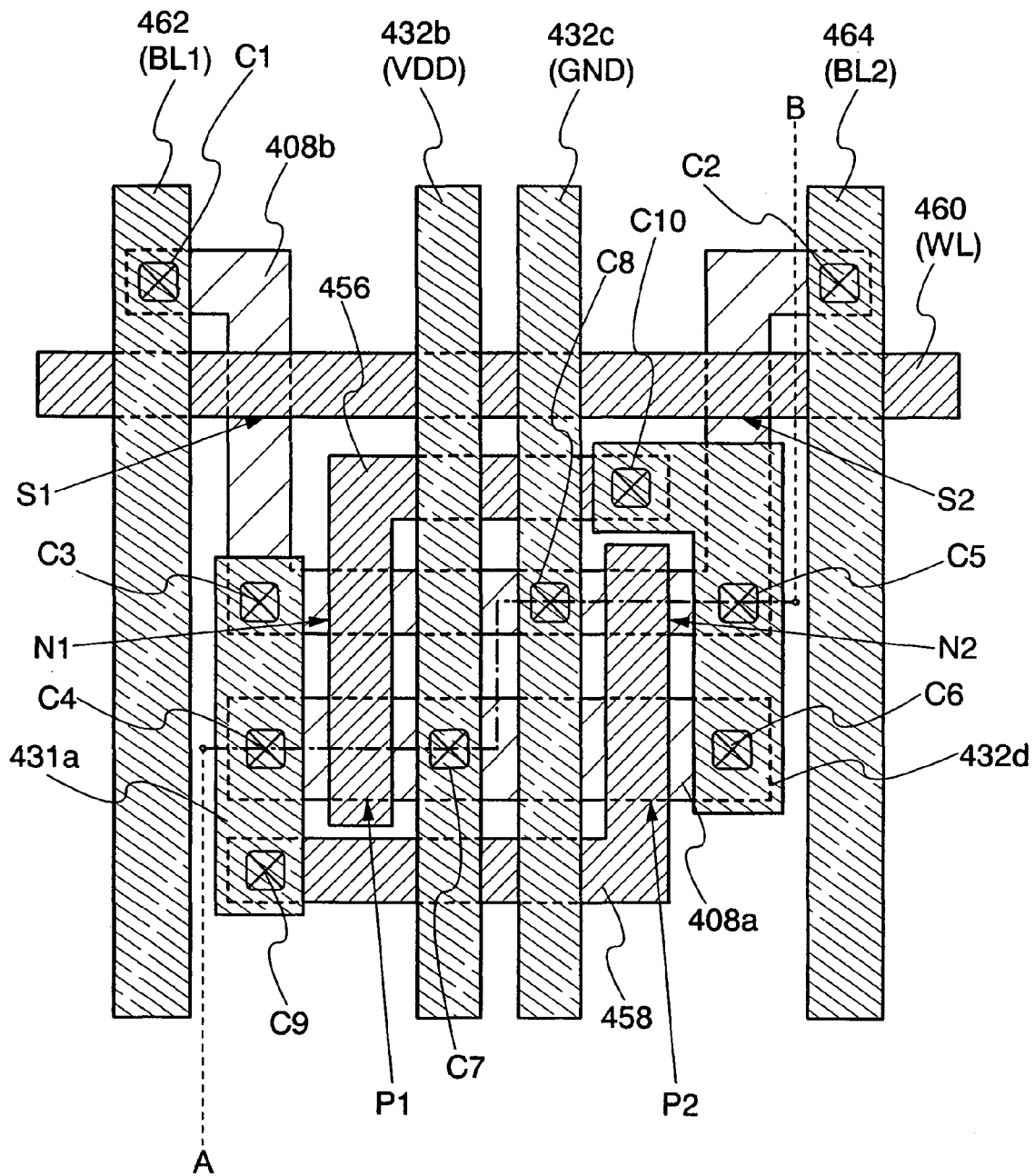
FIG. 8 illustrates a semiconductor device.

FIG. 8 is an exemplary circuit layout of the SRAM shown in FIG. 7. FIG. 8 shows an SRAM which includes a semiconductor film and two wiring layers including a gate wiring layer. Given that a semiconductor film 408b for forming n-channel transistors and a semiconductor film 408a for forming p-channel transistors are located in the lower layer, first wiring layers 456, 458, and 460 are located above the lower layer with an insulating film interposed therebetween. The first wiring layer 456 is a layer for forming gate electrodes, which forms the n-channel transistor N1 and the p-channel transistor P1 by intersecting the semiconductor films 408b and 408a, respectively. The first wiring layer 458 is a layer for forming gate electrodes, which forms the n-channel transistor N2 and the p-channel transistor P2 by intersecting the semiconductor films 408b and 408a, respectively. The first wiring layer 460 is a word line (WL), which forms the switches S1 and S2 by intersecting the semiconductor film 408b. In this manner, the first wiring layers 456, 458, and 460 form gate electrodes by intersecting the semiconductor films 408b and 408a.

Second wiring layers 462, 432b, 432c, and 464 are formed over the first wiring layers 456, 458, and 460 with an insulating layer interposed therebetween. The second wiring layer 462 forms a bit line (BL1); the second wiring layer 464 forms a bit line (BL2); the second wiring layer 432b forms a power supply line (VDD); and the second wiring layer 432c forms a ground potential line (GND).

A contact hole C1 is an opening formed in the insulating layer, and connects the second wiring layer 462 and the semiconductor film 408b. A contact hole C2 is an opening formed in the insulating layer, and connects the second wiring layer 464 and the semiconductor film 408b. A contact hole C3 is an opening formed in the insulating layer, and connects a conductive film 431a which forms a second wiring layer and the semiconductor film 408b. A contact hole C4 is an opening formed in the insulating layer, and connects the conductive film 431a which forms the second wiring layer and the semiconductor film 408a. A contact hole C5 is an opening formed in the insulating layer, and connects a second wiring layer 432d and the semiconductor film 408b. A contact hole C6 is an opening formed in the insulating layer, and connects the second wiring layer 432d and the semiconductor film 408a.

Further, a contact hole C7 is an opening formed in the insulating layer, and connects the second wiring layer 432b and the semiconductor film 408a. A contact hole C8 is an opening formed in the insulating layer, and connects the second wiring layer 432c and the semiconductor film 408b. A contact hole C9 is an opening formed in the insulating layer, and connects the conductive film 431a which forms the second wiring layer and the first wiring layer 458. A contact hole C10 is an opening formed in the insulating layer, and connects the second wiring layer 432d and the first wiring layer 456. In this manner, the SRAM shown in FIG. 8 is formed by the contact holes C1 to C10 which connect the semiconductor films, the first wiring layers, and the second wiring layers.

Next, a manufacturing process of such an SRAM will be described with reference to FIGS. 9A to 9C which are cross-sectional views along a line A-B (the p-channel transistor P1 and the n-channel transistor N2) of FIG. 8.

Figure 9A:
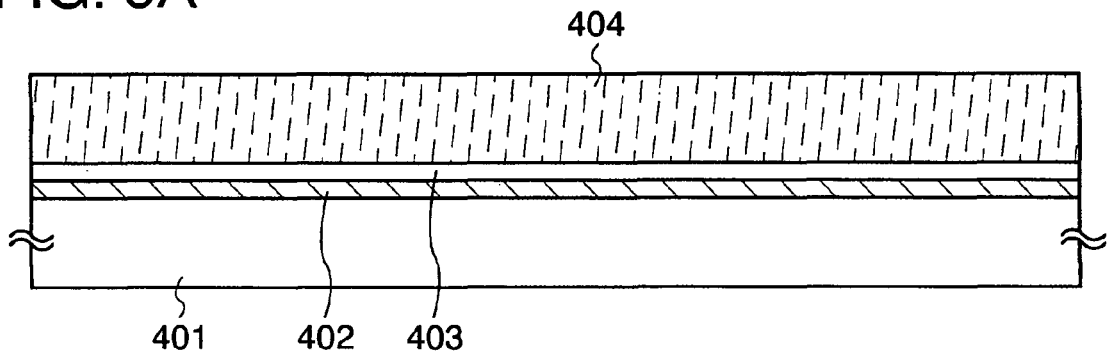
FIGS. 9A to 9C illustrate an exemplary method for manufacturing a semiconductor device.
Figure 9B:
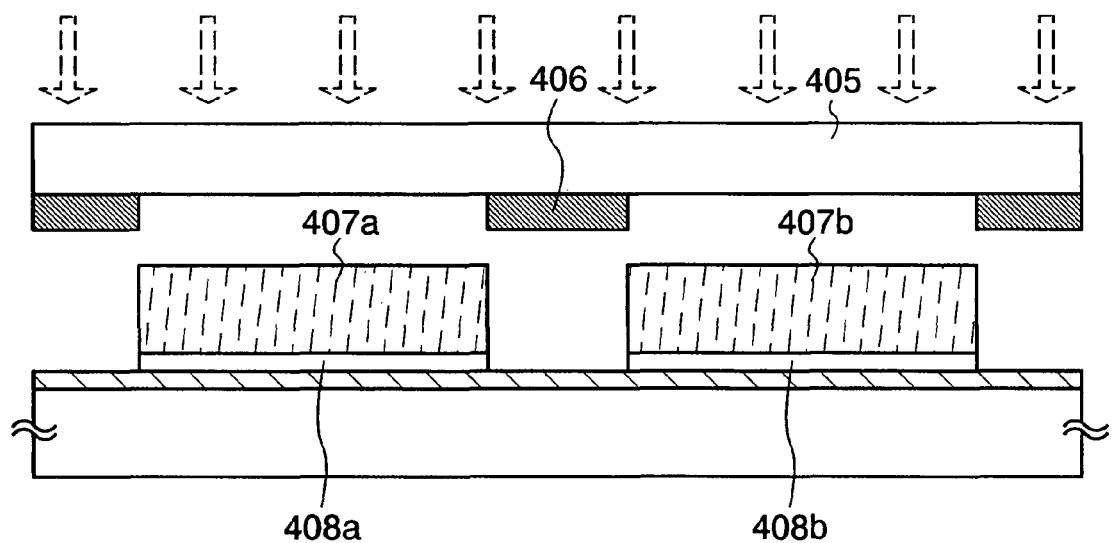
Figure 9C:
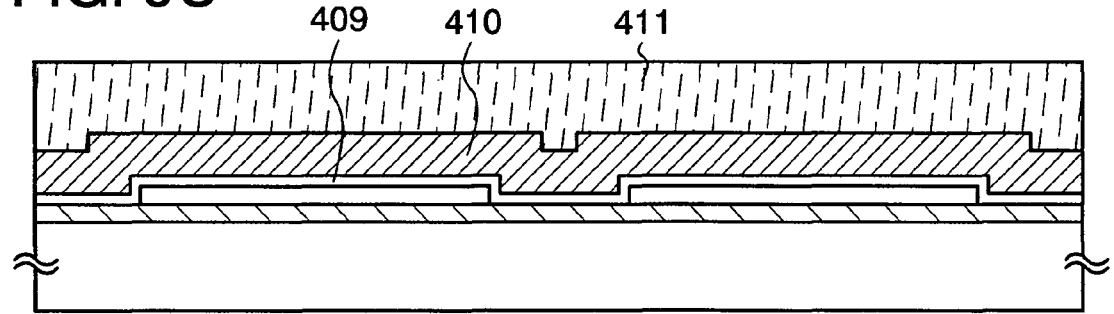

First, a semiconductor film 403 is formed over a substrate 401 with an insulating film 402 functioning as a base film interposed therebetween, and then a resist 404 is formed over the semiconductor film 403 (FIG. 9A).

The substrate 401 is selected from among a glass substrate, a quartz substrate, a metal substrate (e.g., a ceramic substrate or a stainless steel substrate), a semiconductor substrate such as a silicon substrate, and the like. Alternatively, the substrate 401 can be a plastic substrate made of polyethylene terephthalate (PET), polyethylene naphthalate (PEN), polyethersulfone (PES), a substrate made of acrylic, or the like.

The insulating film 402 is formed by a CVD method, a sputtering method, or the like, using an insulating material such as silicon oxide, silicon nitride, silicon oxynitride ($SiO_xN_y$), (x>y>0), or silicon nitride oxide ($SiN_xO_y$) (x>y>0). For example, when the insulating film 402 is formed to have a double-layer structure, it is preferable to form a silicon nitride oxide film as a first insulating film and form a silicon oxynitride film as a second insulating film. Alternatively, a silicon nitride film may be formed as a first insulating film and a silicon oxide film may be formed as a second insulating film. In this manner, formation of the insulating film 402 which functions as a blocking layer can prevent adverse effects of alkaline metals such as sodium or alkaline earth metals contained in the substrate 401 which would otherwise be diffused into elements formed over the substrate. Note that when quartz is used for the substrate 401, the insulating film 402 may be omitted.

The semiconductor film 403 is preferably formed of a crystalline semiconductor film. The crystalline semiconductor film may be any of the following: a film obtained by crystallizing an amorphous semiconductor film formed over the insulating film 402 by thermal treatment or laser irradiation; a film obtained by processing a crystalline semiconductor film formed over the insulating film 402 into an amorphous state, and then recrystallizing it again; and the like.

In the case of performing crystallization or recrystallization by laser irradiation, an LD-pumped continuous wave (CW) laser (e.g., $YVO_4$; a second harmonic (wavelength: 532 nm)) can be used as a laser light source. Although the frequency is not specifically limited to the second harmonic, the second harmonic is superior to harmonics higher than that in terms of energy efficiency. When a semiconductor film is irradiated with CW laser, energy can continuously be given to the semiconductor film. Therefore, once the semiconductor film is made into a molten state, the molten state can be retained. Further, by scanning the semiconductor film with CW laser, a solid-liquid interface of the semiconductor film can be moved, and crystal grains which are long in one direction can be formed along the moving direction. The reason for using a solid-state laser is to obtain more stable output than with a gas laser or the like, and thus more stable treatment can be expected. Note that the laser light source is not limited to a CW laser, and a pulsed laser with a repetition rate of 10 MHz or higher can also be used. When a pulsed laser with a high repetition rate is used, a semiconductor film can be constantly retained in the molten state on the condition that the pulse interval of laser is shorter than the time interval from the point when a semiconductor film is melted until the point when the semiconductor film becomes solidified. Thus, a semiconductor film with crystal grains which are long in one direction can be formed by moving the solid-liquid interface. It is also possible to employ other types of CW lasers or pulsed lasers with a repetition rate of 10 MHz or higher. For example, gas lasers such as an Ar laser, a Kr laser, and a $CO_2$ laser can be used, or solid-state lasers such as a YAG laser, a YLF laser, a $YAlO_3$ laser, a $GdVO_4$ laser, a KGW laser, a KYW laser, an alexandrite laser, a Ti:sapphire laser, a $Y_2O_3$ laser, and a $YVO_4$ laser can be used. In addition, there are ceramic lasers such as a YAG laser, a $Y_2O_3$ laser, a $GdVO_4$ laser, and a $YVO_4$ laser. As a metal vapor laser, a helium-cadmium laser or the like can be given as an example. Laser beams are preferably emitted from a laser Oscillator with $TEM_{00}$ (single transverse mode), which can increase the energy uniformity of a linear beam spot that is obtained on the irradiation surface. Besides, a pulsed excimer laser can also be used.

As the resist 404, a composition containing a photosensitizing agent may be used, which can be either a negative resist (a type of photoresist in which the portion of the photoresist exposed to light remains as a pattern after a development process) or a positive resist (a type of photoresist in which the portion of the photoresist that is unexposed to light remains as a pattern after a development process). Note that in this embodiment mode, a case of using a negative resist is shown.

Next, the resist 404 is exposed to light through a mask in which a metal 406 for blocking light is selectively provided on a light-transmissive film 405, and then the resist 404 is etched. Thus, the resist 404 is selectively removed to form a resist pattern. Then, a portion of the semiconductor film 403 that is not covered with the resist pattern is removed, thereby forming island-shape semiconductor films (FIG. 9B). Here, an example is shown in which the resist 404 is selectively removed to form resists 407a and 407b, and a portion of the semiconductor film 403 that is not covered with the resists 407a and 407b is removed, whereby the island-shape semiconductor films 408a and 408b are formed. Here, the exposure process of the resist 404 is performed by an exposure method using a stepper, an MPA, or the like.

Next, a conductive film 410 is formed so as to cover the island-shape semiconductor films 408a and 408b with a gate insulating film 409 interposed therebetween. Then, a resist 411 is formed over the conductive film 410 (FIG. 9C).

The gate insulating film 409 is formed using silicon oxide, silicon nitride, silicon oxynitride ($SiO_xN_y$) (x>y>0), silicon nitride oxide ($SiN_xO_y$) (x>y>0), or the like. Such an insulating layer is formed by a vapor growth method or a sputtering method. Alternatively, the gate insulating film 409 can be formed by performing high-density plasma treatment such as oxidation treatment or nitridation treatment to the surfaces of the semiconductor films 408a and 408b under an oxygen atmosphere (e.g., an atmosphere containing oxygen ($O_2$) and a rare gas (at least one of He, Ne, Ar, Kr, and Xe), or an atmosphere containing oxygen, hydrogen ($H_2$), and a rare gas) or under a nitrogen atmosphere (e.g., an atmosphere containing nitrogen ($N_2$) and a rare gas (at least one of He, Ne, Ar, Kr, and Xe), an atmosphere containing nitrogen, hydrogen, and a rare gas, or an atmosphere containing ammonia and a rare gas). By forming the gate insulating film 409 by oxidizing or nitriding the surfaces of the semiconductor films 408a and 408b by high-density plasma treatment, defect level density which would trap electrons or holes can be reduced.

The conductive film 410 is formed using a high-melting-point metal such as tungsten, molybdenum, titanium, tantalum, chromium, or niobium. Alternatively, an alloy of the above metal, conductive metal nitride, or conductive metal oxide can be used, such as an alloy of molybdenum and tungsten, titanium nitride, or tungsten nitride. As a further alternative, a stacked structure of tantalum nitride and tungsten can be used. It is also possible to use polysilicon which is doped with an impurity element such as phosphorus.

Figure 10A:
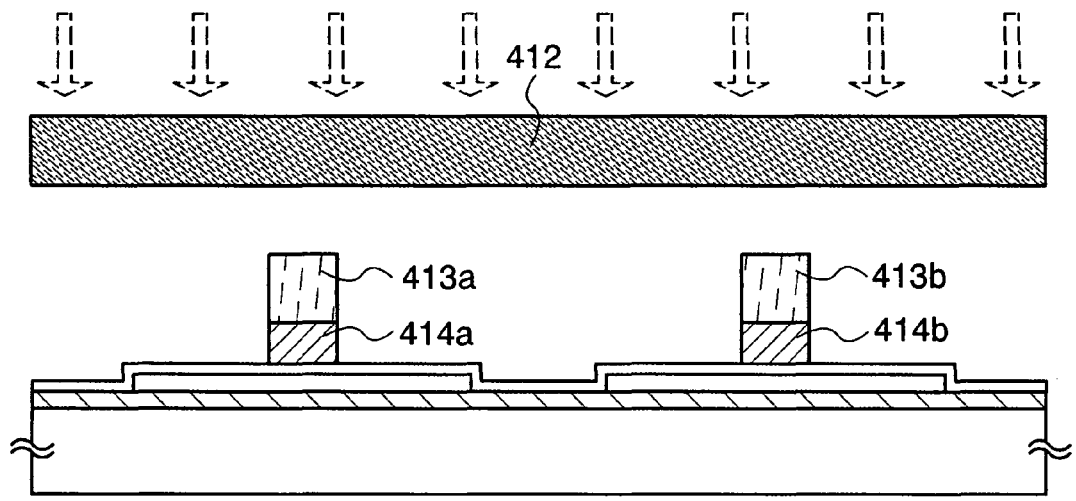
FIGS. 10A to 10C illustrate an exemplary method for manufacturing a semiconductor device.

Next, the resist 411 is selectively exposed to light through a holographic recording medium 412 and then the resist 411 is selectively removed by etching, whereby a resist pattern is formed. Then, a portion of the conductive film 410 that is not covered with the resist pattern is removed, whereby conductive films which function as gate electrodes are formed (FIG. 10A). Here, an example is shown in which the resist 411 is removed to form resists 413a and 413b, and a portion of the conductive film 410 that is not covered with the resists 413a and 413b is selectively removed, whereby gate electrodes 414a and 414b are formed.

Note that the resists 413a and 413b which are used in forming the conductive films to function as the gate electrodes 414a and 414b in FIG. 10A are formed by a holographic exposure method. Specifically, an exposure process is performed through the steps of forming a fringe pattern in a holographic recording medium by using any of the recording steps shown in the above embodiment modes, and illuminating the resist 411 with a laser beam through the holographic recording medium having the fringe pattern (the holographic recording medium 412). Note that when a harmonic of the laser beam which is used in the recording step for forming the fringe pattern in the holographic recording medium 412 is employed as the laser beam used for illuminating the resist 411, a pattern which is smaller than the original mask pattern can be obtained.

Figure 10B:
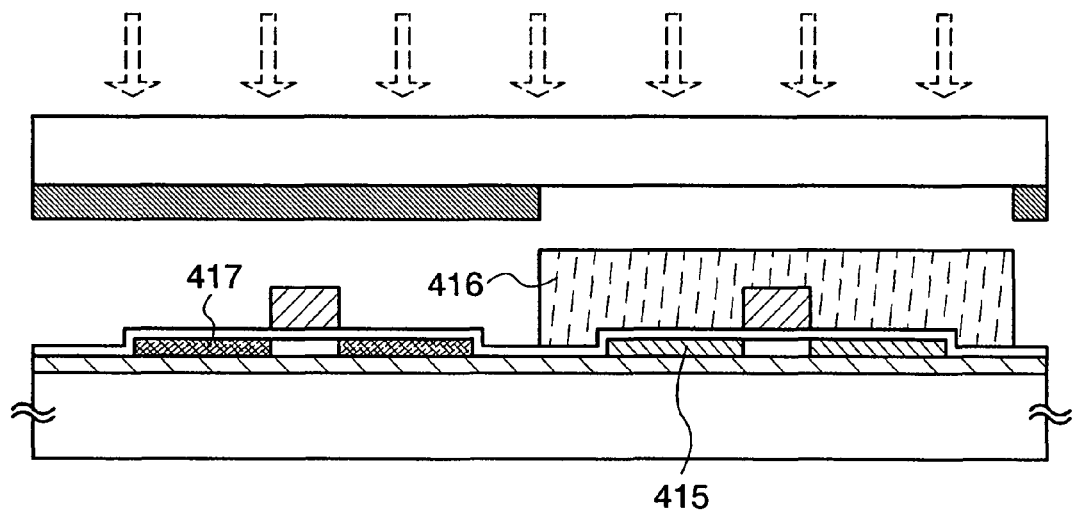

Next, the semiconductor films 408a and 408b are doped with an impurity element which imparts n-type conductivity at a low concentration, using the gate electrodes 414a and 414b and the resists 413a and 413b as masks or using the gate electrodes 414a and 414b as masks. Thus, low-concentration impurity regions 415 are formed. After that, a resist 416 is selectively formed over the semiconductor film 408b and the gate electrode 414b, and the semiconductor film 408a is doped with an impurity element which imparts p-type conductivity at a high concentration, using the gate electrode 414a as a mask (FIG. 10B). Through such steps, a channel region is formed in a part of the semiconductor film 408a which is located below the gate electrode 414a, and in the other regions of the semiconductor film 408a, p-type high-concentration impurity regions 417 which serve as a source region and a drain region are formed.

Figure 10C:
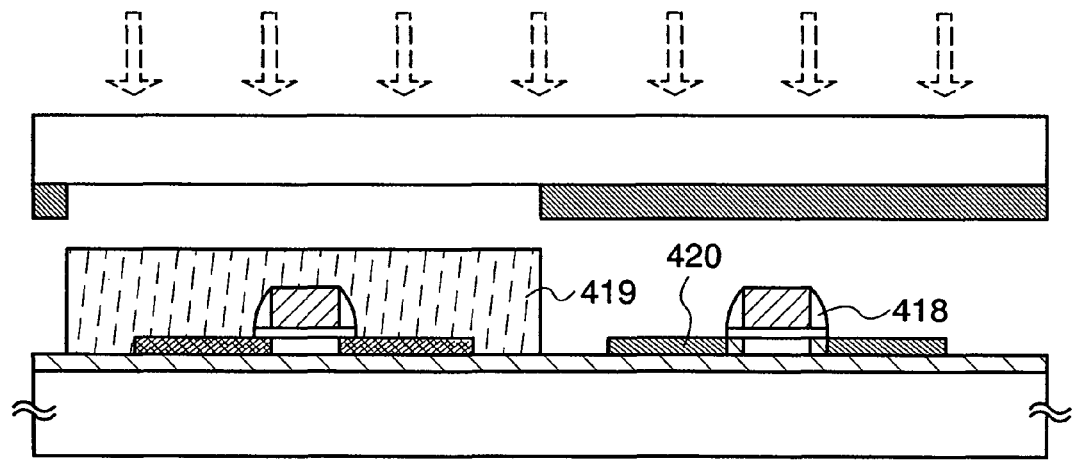

Next, after removing the resist 416, an insulating film is formed so as to cover the gate insulating film 409, the gate electrode 414a, and the gate electrode 414b. The insulating film is formed to have either a single-layer structure or a stacked-layer structure by a CVD method, a sputtering method, or the like, using a layer containing an inorganic material such as silicon, silicon oxide, or silicon nitride, and/or a layer containing an organic material such as organic resin. Next, the insulating layer is etched by anisotropic etching (mainly in the perpendicular direction) to form insulating films (also called sidewalls) 418 on opposite side surfaces of the gate electrode 414a and the gate electrode 414b. After that, a resist 419 is selectively formed over the semiconductor film 408a and the gate electrode 414a. Then, the semiconductor film 408b is doped with an impurity element which imparts n-type conductivity at a high concentration, using as masks the gate electrode 414b and the insulating films 418 having a contact with the side surfaces of the gate electrode 414b (FIG. 10C). Through such steps, a channel region is formed in a part of the semiconductor film 408b which is located below the gate electrode 414b, and low-concentration impurity regions (all called LDD regions: Lightly Doped Drain regions) having n-type conductivity are formed in a part of the semiconductor film 408b which is located below the insulating films 418. In addition, high-concentration impurity regions 420 having n-type conductivity, which function as a source region and a drain region, are formed in the other regions of the semiconductor film 408b.

Figure 11A:
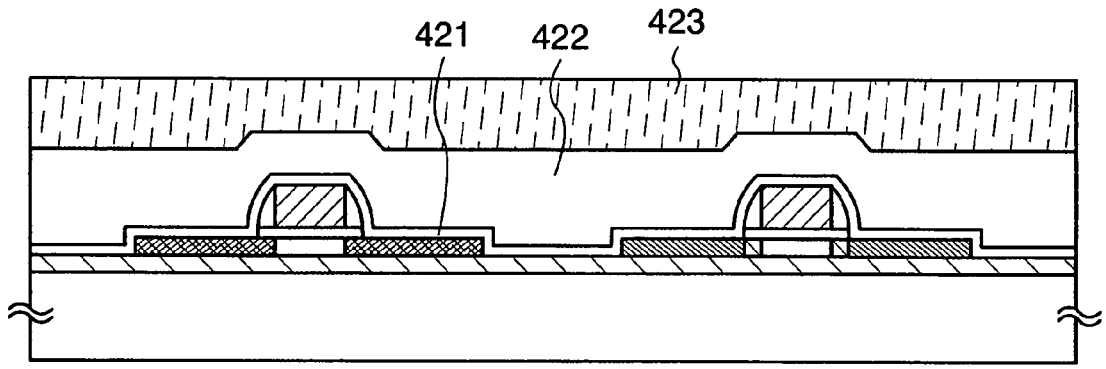
FIGS. 11A to 11C illustrate an exemplary method for manufacturing a semiconductor device.

Next, an insulating film is formed so as to cover the semiconductor films 408a and 408b and the gate electrodes 414a and 414b. Then, a resist is formed over the insulating film (FIG. 11A). Here, an example is shown in which insulating films 421 and 422 are stacked as the insulating film, and then a resist 423 is formed over the insulating film 422.

The insulating films 421 and 422 can be formed by a CVD method, a sputtering method, or the like, using silicon oxide, silicon oxynitride ($SiO_xN_y$) (x>y>0), silicon nitride oxide ($SiN_xO_y$) (x>y>0), or the like. Alternatively, the insulating films 421 and 422 can be formed to have a single-layer structure or a stacked-layer structure of an organic material such as polyimide, polyamide, polyvinyl phenol, benzocyclobutene, acrylic, or epoxy; a siloxane material such as siloxane resin; oxazole resin; and/or the like. Note that siloxane is a material having a skeletal structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent. Oxazole resin includes, for example, photosensitive polybenzoxazole or the like. Photosensitive polybenzoxazole is a material having a low dielectric constant (a dielectric constant of 2.9 at 1 MHz at room temperature), high heat resistance (a thermal decomposition temperature of 550° C. at a temperature rise of 5° C./min by TG/DTA (Thermogravimetry-Differential Thermal Analysis), and low water absorption (0.3% in 24 hours at room temperature). Oxazole resin has a lower dielectric constant (approximately 2.9) as compared with a dielectric constant of polyimide (approximately 3.2 to 3.4) or the like. Therefore, generation of parasitic capacitance can be suppressed and high-speed operation can be performed. Here, the insulating film 421 is formed by a CVD method using silicon oxide, silicon oxynitride ($SiO_xN_y$) (x>y>0), or silicon nitride oxide ($SiN_xO_y$) (x>y>0), while the insulating film 422 is formed using an organic material such as polyimide, polyamide, polyvinyl phenol, benzocyclobutene, acrylic, or epoxy; a siloxane material such as siloxane resin; oxazole resin; and the like.

Figure 11B:
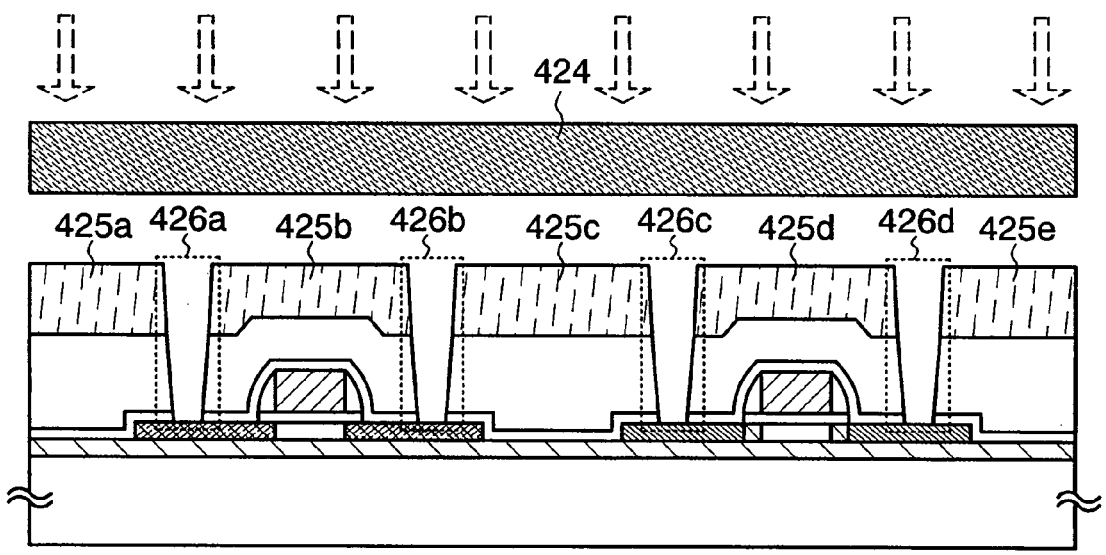

Next, the resist 423 is selectively illuminated with a laser beam through a holographic recording medium 424 and then the resist 423 is selectively removed by etching, whereby a resist pattern is formed. Then, a portion of the insulating films 421 and 422 that is not covered with the resist pattern is removed to expose the semiconductor films 408a and 408b (FIG. 11B). Here, an example is shown in which resists 425a to 425e are formed by selectively removing the resist 423, and a portion of the insulating films 421 and 422 that is not covered with the resists 425a to 425e is removed, whereby contact holes 426a to 426e are formed.

By using holographic reduction-projection exposure, contact holes having smaller diameters than the original mask pattern can be formed. As a result, the distance between each of the contact holes 426a to 426d can be narrowed, and thus the degree of integration can be improved.

In the manufacturing process, the distortion of the substrate may vary from step to step (e.g., before and after the formation of the conductive film). In that case, the maximum difference in elevation of the surface of the exposure object also varies. Thus, it is preferable to change the thickness of the light-shielding film of the original mask which is used for forming a fringe pattern in the holographic recording medium in accordance with each step.

Figure 11C:
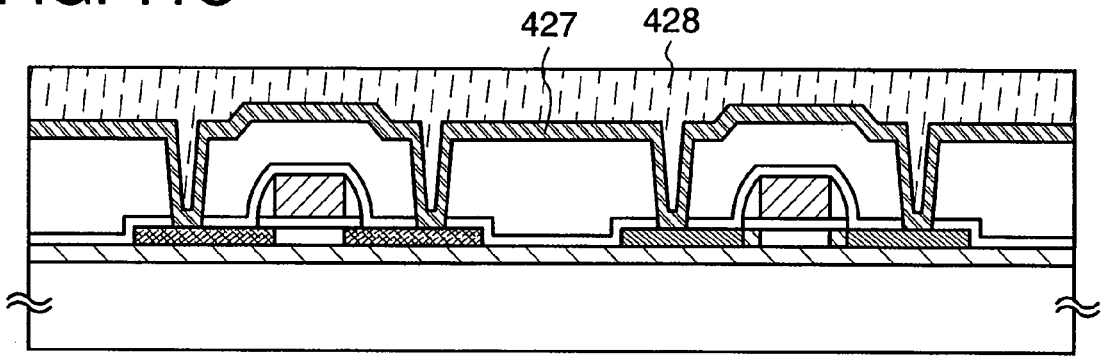

Next, the resists 425a to 425e are removed and a conductive film 427 is formed over the insulating film 422 and the contact holes 426a to 426d. Then, a resist 428 is formed over the conductive film 427 (FIG. 11C).

The conductive film 427 can be formed to have either a single-layer structure or a stacked-layer structure of an element selected from among aluminum, tungsten, titanium, tantalum, molybdenum, nickel, and neodymium, or an alloy containing a plurality of such elements. For example, as a conductive film which is made of an alloy containing a plurality of the above-described elements, it is possible to form an aluminum alloy containing titanium, an aluminum alloy containing neodymium, or the like. In the case of forming a stacked-layer structure, for example, a structure where an aluminum layer or the above-described aluminum alloy layer is sandwiched between titanium layers can be used. The conductive film 431b forms the power supply line (VDD), while the conductive film 431c forms the ground potential line (GND).

Figure 12A:
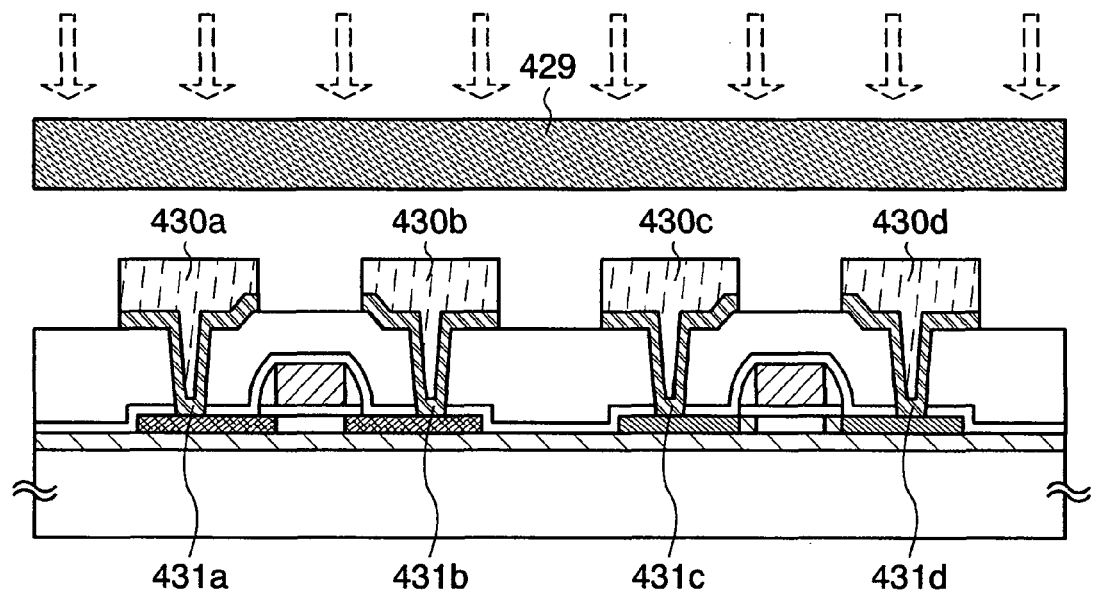
FIGS. 12A and 12B illustrate an exemplary method for manufacturing a semiconductor device.
Figure 12B:
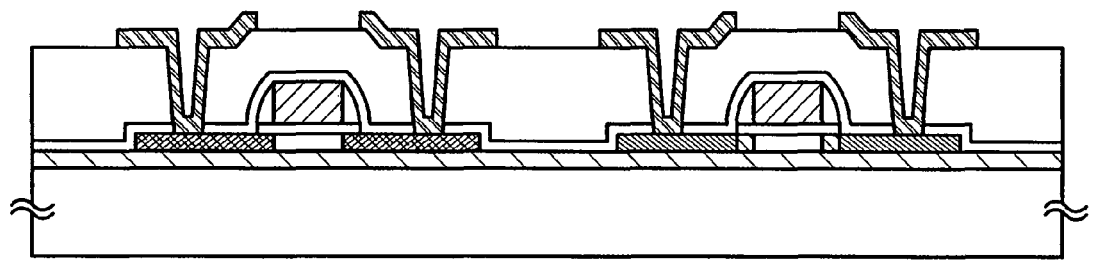

Next, the resist 428 is illuminated with a laser beam through a holographic recording medium 429, and the resist 428 is selectively removed by etching, whereby a resist pattern is formed. Then, a portion of the conductive film 427 that is not covered with the resist pattern is selectively removed to form a conductive film which functions as a source electrode or a drain electrode (FIG. 12A). Here, an example is shown in which resists 430a to 430d are formed by selectively removing the resist 428, and a portion of the conductive film 427 that is not covered with the resists 430a to 430d is selectively removed, whereby the conductive films 431a to 431b which function as source electrodes or drain electrodes are formed.

Then, by removing the resists 430a to 430d, transistors can be formed. In this manner, by using any of the holographic exposure methods shown in Embodiment Modes 1 to 4 for the process of manufacturing a semiconductor device, high-accuracy alignment can be performed in forming micropatterns even when combined with another exposure method.

Although this embodiment mode has illustrated an example where a holographic exposure method is applied to the formation of gate electrodes, contact holes, and source or drain electrodes, the invention is not limited to these, and the holographic exposure method may be applied to all of the steps including the formation of island-shape semiconductor films and the like, or may be applied to only the formation of gate electrodes. That is, the holographic exposure method may be applied to at least one of the steps included in the process of manufacturing a semiconductor device.

Note that this embodiment mode can be freely combined with other embodiment modes in this specification. For example, the exposure method shown in this embodiment mode can be replaced by total internal reflection holography.

Embodiment Mode 6

This embodiment mode will describe examples of the application of a semiconductor device which is obtained by using the manufacturing method shown in Embodiment Mode 5. Specifically, examples of the application of a semiconductor device which is capable of wireless data communication will be described with reference to the drawings. A semiconductor device capable of wireless data communication is also called an RFID tag, an ID tag, an IC tag, an IC chip, an RF tag, a wireless tag, an electronic tag, or a wireless chip depending on the use application.

Figure 13A:
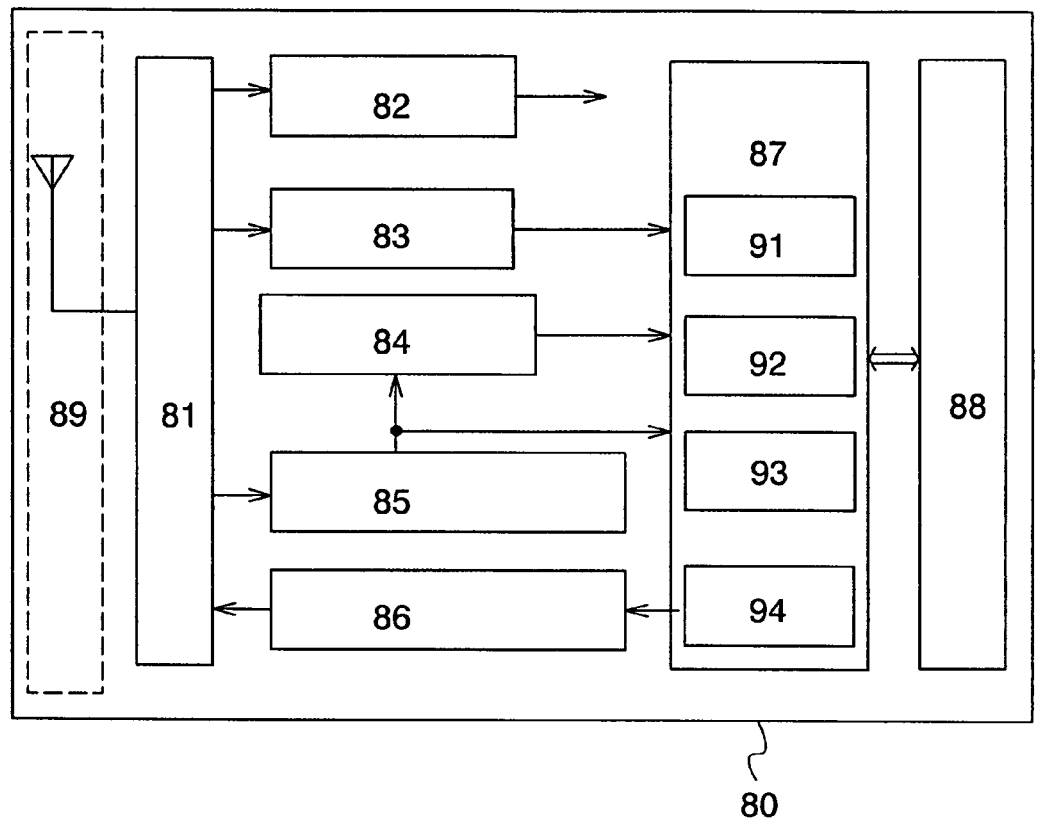
FIGS. 13A to 13C illustrate examples of the application of a semiconductor device which is manufactured by using a manufacturing method of the invention.

A semiconductor device 80 has a function of wireless data communication, and includes a high-frequency circuit 81, a power supply circuit 82, a reset circuit 83, a clock generation circuit 84, a data demodulation circuit 85, a data modulation circuit 86, a control circuit 87 for controlling other circuits, a memory circuit 88, and an antenna 89 (FIG. 13A). The high-frequency circuit 81 is a circuit which receives signals from the antenna 89, and outputs signals that are received from the data modulation circuit 86 to the antenna 89; the power supply circuit 82 is a circuit which generates power supply potentials from received signals; the reset circuit 83 is a circuit which generates reset signals; the clock generation circuit 84 is a circuit which generates various clock signals based on the signals input from the antenna 89; the data demodulation circuit 85 is a circuit which demodulates the received signals and outputs them to the control circuit 87; and the data modulation circuit 86 is a circuit which modulates the signals received from the control circuit 87. In addition, the control circuit 87 includes a code extraction circuit 91, a code judging circuit 92, a CRC judging circuit 93, and an output unit circuit 94. Note that the code extraction circuit 91 is a circuit which extracts a plurality of codes that are contained in the instructions transmitted to the control circuit 87; the code judging circuit 92 is a circuit which judges the content of the instructions by comparing the extracted code with a reference code; and the CRC judging circuit 93 is a circuit which detects the presence of transmission errors and the like based on the judged code.

In FIG. 13A, the semiconductor circuit 80 also includes the high-frequency circuit 81 and the power supply circuit 82 that are analog circuits, in addition to the control circuit 87. Even for formation of such circuits, a holographic exposure method can be used as described in the above embodiment modes. By using such an exposure method, the size of the transistors can be reduced. Therefore, the chip size can be reduced even when a glass substrate or the like that has low planarity is used.

Next, an example of the operation of the above-described semiconductor device will be described. First, the antenna 89 receives a radio signal. The radio signal is transmitted to the power supply circuit 82 through the high-frequency circuit 81, and the power supply circuit 82 generates a high power supply potential (hereinafter referred to as VDD). VDD is supplied to each circuit included in the semiconductor device 80. In addition, a signal transmitted to the data demodulation circuit 85 through the high-frequency circuit 81 is demodulated (hereinafter the signal is referred to as a demodulated signal). Further, a signal transmitted to the reset circuit 83 through the high-frequency circuit 81 and the demodulated signal which has passed through the clock generation circuit 84 are transmitted to the control circuit 87. The signals transmitted to the control circuit 87 are analyzed by the code extraction circuit 91, the code judging circuit 92, the CRC judging circuit 93, and the like. Then, data on the semiconductor device which is stored in the memory circuit 88 is output in response to the analyzed signal. The output data of the semiconductor device is encoded in the output unit circuit 94. Further, the encoded data of the semiconductor device 80 is modulated in the data modulation circuit 86 and then superposed on a radio signal to be transmitted through the antenna 89. Note that the low power supply potential (hereinafter referred to as VSS) is common to the plurality of circuits which constitute the semiconductor device 80; therefore, GND can be used as the VSS.

In this manner, by transmitting signals to the semiconductor device 80 from a reader/writer and transmitting signals from the semiconductor device 80 to the reader/writer, data on the semiconductor device can be read out.

The semiconductor device 80 may be either of a type where no power supply (battery) is built-in but electromagnetic waves are used to supply a power supply voltage to each circuit, or of a type where both electromagnetic waves and a power supply (battery) are used to generate a power supply voltage for each circuit.

Figure 13B:
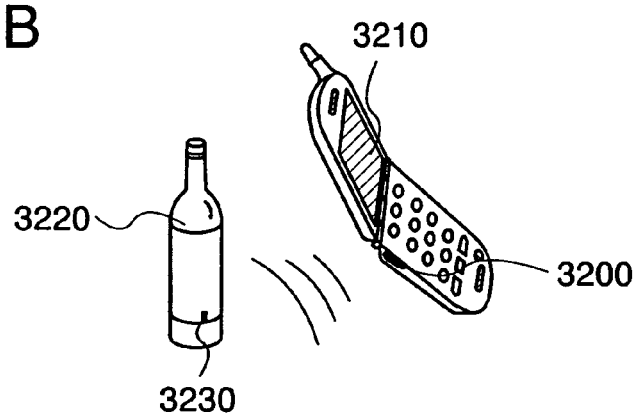
Figure 13C:
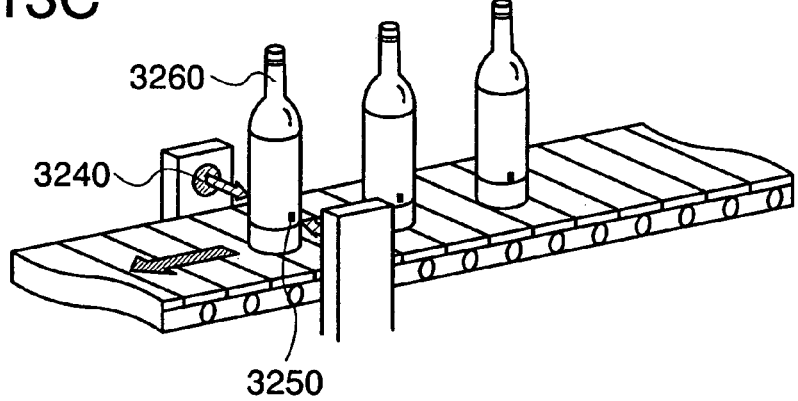

Next, examples of the application of the semiconductor device capable of wireless data communication will be described. A side surface of a portable terminal which includes a display portion 3210 is provided with a reader/writer 3200, and a side surface of a product 3220 is provided with a semiconductor device 3230 (FIG. 13B). When the reader/writer 3200 is put close to the semiconductor device 3230 on the product 3220, data on the raw material or the source of the product, inspection result in each production step, history of the distribution process, product description, and the like is displayed on the display portion 3210. In addition, when a product 3260 is carried on a belt conveyor, inspection of the product 3260 can be performed by using a reader/writer 3240 and a semiconductor device 3250 provided to the product 3260 (FIG. 13C). In this manner, by using the semiconductor device for a system, data acquisition can be easily performed, and a higher function and higher added value can be realized.

In addition to the above examples, a semiconductor device which is manufactured using the exposure method of the invention can be applied to various uses, and it can be applied to any product which can wirelessly obtain data on an object such as a history thereof and which can be effectively utilized in production, management, and the like. For example, such a semiconductor device may be provided for bills, coins, securities, certificates, bearer bonds, packaging containers, books, storage media, personal belongings, vehicles, foods, clothes, healthcare items, everyday articles, medicals, and electronic devices. Examples of these products will be described with reference to FIGS. 14A to 14H.

The bills and coins include currency in the market and include notes that are circulating as the real money in specific areas (cash voucher), memorial coins, and the like. The securities include checks, certificates, promissory notes, and the like (see FIG. 14A). The certificates include driver's licenses or resident's cards, and the like (see FIG. 14B). The bearer bonds include stamps, rice coupons, various gift coupons, and the like (see FIG. 14C). The packaging containers include paper for wrapping a lunch box or the like, plastic bottles, and the like (see FIG. 14D). The books include documents and the like (see FIG. 14E).

Figure 14A:
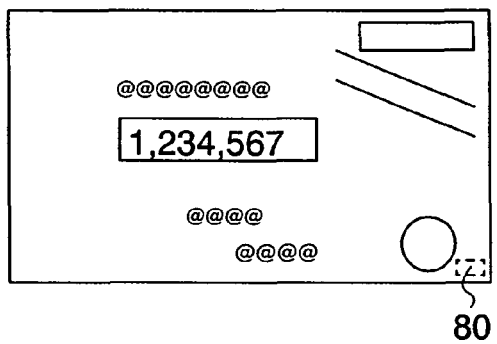
FIGS. 14A to 14H illustrate examples of the application of a semiconductor device which is manufactured by using a manufacturing method of the invention.
Figure 14B:
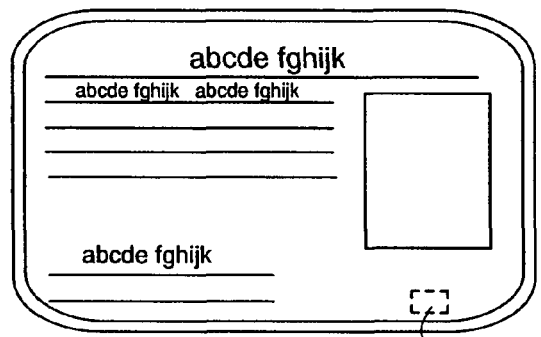
Figure 14C:
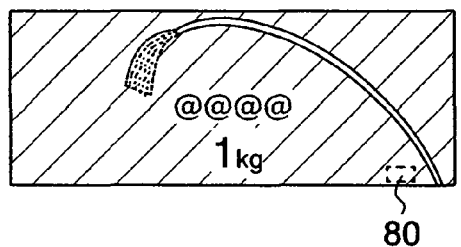
Figure 14D:
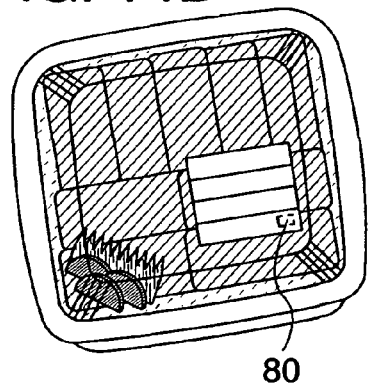
Figure 14E:
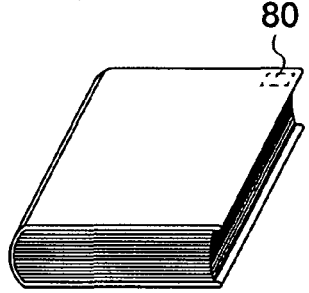
Figure 14F:
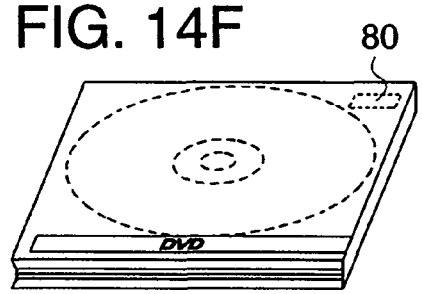
Figure 14G:
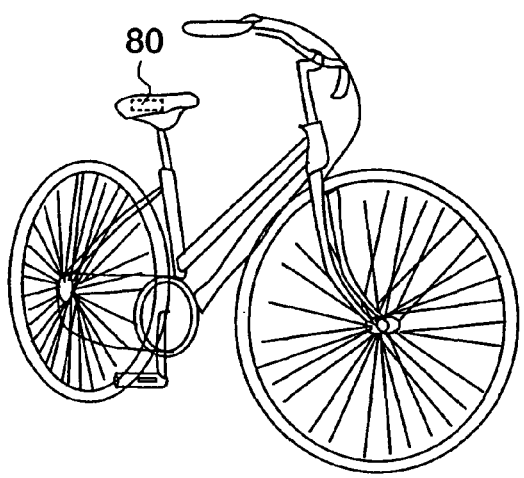
Figure 14H:
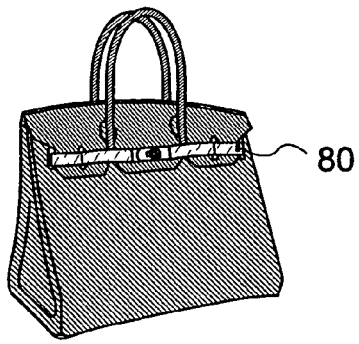

The storage media include DVD software, video tapes, and the like (see FIG. 14F). The means of transportation include wheeled cycles or vehicles such as bicycles, vessels, and the like (see FIG. 14G). The personal belongings include bags, glasses, and the like (see FIG. 14H). The foods include food items, beverages, and the like. The clothes include clothing, footwear, and the like. The healthcare items include medical devices, health appliances, and the like. The everyday articles include furniture, lighting apparatuses, and the like. The medicals include medicines, agricultural chemicals, and the like. The electronic devices include liquid crystal display devices, EL display devices, television sets (television receivers or thin television receivers), mobile phones, and the like.

When the semiconductor device 80 is provided for bills, coins, securities, certificates, bearer bonds, and the like, forgery of them can be prevented. When the semiconductor device 80 is provided for packaging containers, books, storage media, personal belongings, foods, everyday articles, electronic devices, and the like, efficiency of an inspection system, a system of a rental shop, and the like can be improved. When the semiconductor device 80 is provided for means of transportation, healthcare items, medicals, and the like, forgery and theft of them can be prevented and wrong use of the medicines can be prevented. The semiconductor device 80 may be attached to the surface of a product or incorporated into a product. For example, the semiconductor device 80 may be incorporated into paper of a book or organic resin of a package. By providing a semiconductor device which is formed in a small size using the exposure method described in the above embodiment modes, damage on the elements included in the semiconductor device can be prevented even when the semiconductor device is provided on paper or the like.

In this manner, when the semiconductor device is provided for packaging containers, storage media, personal belongings, foods, clothes, everyday articles, electronic devices, and the like, efficiency of an inspection system, a system of a rental shop, and the like can be increased. In addition, when the semiconductor device is provided for cycles or vehicles, forgery and theft of them can be prevented. Further, when the semiconductor device is implanted into creatures such as animals, each creature can be easily identified. For example, when a semiconductor device with a sensor is implanted into creatures such as domestic animals, not only the year of birth, sex, breed, species, and the like but also the health conditions such as the current body temperature can be easily managed.

Note that this embodiment mode can be freely combined with other embodiment modes in this specification.

The present application is based on Japanese Priority application No. 2006-149779 filed on May 30, 2006 with the Japanese Patent Office, the entire contents of which are hereby incorporated by reference.

What is claimed is:

1. A method for manufacturing a semiconductor device, comprising the steps of:
    splitting a laser beam emitted from a laser oscillator into a first laser beam and a second laser beam;
    forming a fringe pattern in a holographic recording medium by illuminating the holographic recording medium with the first laser beam through a mask and illuminating the holographic recording medium with the second laser beam;
    forming a resist over a film formed over a first substrate; and
    illuminating the resist with a third laser beam from the laser oscillator through the holographic recording medium,
    wherein the mask is a second substrate having a light-shielding film formed over its surface,
    wherein a thickness of the light-shielding film is in a range of 0.3 to 10 μm, inclusive,
    wherein a wavelength of the third laser beam is shorter than wavelengths of the first laser beam and the second laser beam,
    wherein the laser beam is converted into a harmonic by a first nonlinear optical element before the laser beam is split into the first laser beam and the second laser beam, and
    wherein the third laser beam is obtained by removing the first nonlinear optical element and inserting a second nonlinear optical element.

2. The method for manufacturing a semiconductor device according to claim 1, wherein the light-shielding film contains at least any one of emulsion, iron oxide, molybdenum silicide, and chromium.

3. The method for manufacturing a semiconductor device according to claim 1, wherein the light-shielding film contains one of an inorganic material and an organic material in which at least one of pigment and dye is dispersed.

4. The method for manufacturing a semiconductor device according to claim 1, the film is one of a conductive film, a semiconductor film, and an insulating film.

5. The method for manufacturing a semiconductor device according to claim 1, wherein the step of illuminating the resist is performed by using an autofocusing method.

6. The method for manufacturing a semiconductor device according to claim 1, wherein the step of forming the fringe pattern and the step of illuminating the resist are performed by using a prism.

7. The method for manufacturing a semiconductor device according to claim 1, wherein the step of forming the fringe pattern and the step of illuminating the resist are selected by using a shutter.

8. The method for manufacturing a semiconductor device according to claim 1, wherein the laser oscillator is a solid-state laser oscillator.

9. A method for manufacturing a semiconductor device, comprising the steps of:
    splitting a laser beam emitted from a laser oscillator into a first laser beam and a second laser beam;
    forming a fringe pattern in a holographic recording medium by illuminating the holographic recording medium with the first laser beam through a mask and illuminating the holographic recording medium with the second laser beam;
    forming a resist over a film formed over a first substrate; and
    illuminating the resist with a third laser beam from the laser oscillator through the holographic recording medium,
    wherein the mask is a second substrate having a light-shielding film formed over its surface, the light-shielding film having a thickness greater than or equal to a maximum difference in elevation of a surface of the resist,
    wherein a wavelength of the third laser beam is shorter than wavelengths of the first laser beam and the second laser beam,
    wherein the laser beam is converted into a harmonic by a first nonlinear optical element before the laser beam is split into the first laser beam and the second laser beam, and
    wherein the third laser beam is obtained by removing the first nonlinear optical element and inserting a second nonlinear optical element.

10. The method for manufacturing a semiconductor device according to claim 9, wherein the light-shielding film contains at least any one of emulsion, iron oxide, molybdenum silicide, and chromium.

11. The method for manufacturing a semiconductor device according to claim 9, wherein the light-shielding film contains one of an inorganic material and an organic material in which at least one of pigment and dye is dispersed.

12. The method for manufacturing a semiconductor device according to claim 9, the film is one of a conductive film, a semiconductor film, and an insulating film.

13. The method for manufacturing a semiconductor device according to claim 9, wherein the step of illuminating the resist is performed by using an autofocusing method.

14. The method for manufacturing a semiconductor device according to claim 9, wherein the step of forming the fringe pattern and the step of illuminating the resist are performed by using a prism.

15. The method for manufacturing a semiconductor device according to claim 9, wherein the step of forming the fringe pattern and the step of illuminating the resist are selected by using a shutter.

16. The method for manufacturing a semiconductor device according to claim 9, wherein the laser oscillator is a solid-state laser oscillator.

17. A method for manufacturing a semiconductor device, comprising the steps of:
- splitting a laser beam emitted from a first laser oscillator into a first laser beam and a second laser beam;
- forming a fringe pattern in a holographic recording medium by illuminating the holographic recording medium with the first laser beam through a mask and illuminating the holographic recording medium with the second laser beam;
- forming a resist over a film formed over a first substrate; and
- illuminating the resist with a third laser beam from a second laser oscillator through the holographic recording medium,
- wherein the mask is a second substrate having a light-shielding film formed over its surface,
- wherein a thickness of the light-shielding film is in a range of 0.3 to 10 µm, inclusive,
- wherein a wavelength of the third laser beam is shorter than wavelengths of the first laser beam and the second laser beam,
- wherein the step of forming the fringe pattern and the step of illuminating the resist are selected by using a shutter,
- wherein the laser beam is converted into a harmonic by a first nonlinear optical element before the laser beam is split into the first laser beam and the second laser beam, and
- wherein the third laser beam is obtained by removing the first nonlinear optical element and inserting a second nonlinear optical element.

18. The method for manufacturing a semiconductor device according to claim 17, wherein the light-shielding film contains at least any one of emulsion, iron oxide, molybdenum silicide, and chromium.

19. The method for manufacturing a semiconductor device according to claim 17, wherein the light-shielding film contains one of an inorganic material and an organic material in which at least one of pigment and dye is dispersed.

20. The method for manufacturing a semiconductor device according to claim 17, the film is one of a conductive film, a semiconductor film, and an insulating film.

21. The method for manufacturing a semiconductor device according to claim 17, wherein the step of illuminating the resist is performed by using an autofocusing method.

22. The method for manufacturing a semiconductor device according to claim 17, wherein the step of forming the fringe pattern and the step of illuminating the resist are performed by using a prism.

23. The method for manufacturing a semiconductor device according to claim 17, wherein the first laser oscillator is the same as the second laser oscillator.

24. The method for manufacturing a semiconductor device according to claim 17, wherein each of the first laser oscillator and the second laser oscillator is a solid-state laser oscillator.

* * * * *